United States Patent
Sonobe et al.

[19]

[11] Patent Number: 6,054,716

[45] Date of Patent: Apr. 25, 2000

[54] SEMICONDUCTOR LIGHT EMITTING DEVICE HAVING A PROTECTING DEVICE

[75] Inventors: Masayuki Sonobe; Tsuyoshi Tsutsui; Shunji Nakata; Norikazu Itoh; Shinji Isokawa; Hidekazu Toda, all of Kyoto, Japan

[73] Assignee: Rohm Co., Ltd., Kyoto, Japan

[21] Appl. No.: 09/003,145

[22] Filed: Jan. 6, 1998

[30] Foreign Application Priority Data

| Jan. 10, 1997 | [JP] | Japan | 9-003003 |
| Jan. 10, 1997 | [JP] | Japan | 9-003004 |
| Jul. 30, 1997 | [JP] | Japan | 9-204681 |
| Jul. 30, 1997 | [JP] | Japan | 9-204682 |
| Jul. 30, 1997 | [JP] | Japan | 9-204683 |
| Jul. 30, 1997 | [JP] | Japan | 9-204684 |
| Jul. 30, 1997 | [JP] | Japan | 9-204685 |
| Oct. 3, 1997 | [JP] | Japan | 9-271037 |
| Oct. 3, 1997 | [JP] | Japan | 9-271038 |
| Oct. 3, 1997 | [JP] | Japan | 9-271040 |

[51] Int. Cl.$^7$ .................................................. H01L 27/15
[52] U.S. Cl. .............................. 250/552; 257/84; 257/99; 257/603
[58] Field of Search .................... 250/552; 257/84, 257/85, 99, 603

[56] References Cited

U.S. PATENT DOCUMENTS 5,798,536  8/1998  Tsutsui ........................................ 257/99

5,914,501  6/1999  Antle et al. ................................ 257/99

FOREIGN PATENT DOCUMENTS 55-143081A  11/1980  Japan ...................................... 257/603

*Primary Examiner*—Que T. Le
*Assistant Examiner*—Kevin Pyo
*Attorney, Agent, or Firm*—Arent, Fox Kintner Plotkin & Kahn

[57] ABSTRACT

A semiconductor light emitting device incorporates therein with (a) a light emitting portion formed by semiconductor overlying layers including a first conductivity layer and a second conductivity layer in order to a light emitting layer, and (b) a protecting element portion provided in electrical connection between said first conductivity type layer and said second conductivity type layer so that said light emitting portion is protected against at least a reverse voltage applied to said light emitting portion. The light emitting portion and the protecting element portion can be formed by separate chips or in one chip having the both. They are formed into a lamp-type or chip-type light emitting device. The incorporation of the protecting element increase the reverse-voltage resistance for a compound semiconductor, such as galium-itride or the like, that is less resistive to reverse voltages applied. If a zener diode is employed as a protecting element, the protection is also available against high forward voltages. Therefore, it is possible to prevent against damages due to static electricity even during mafacture stages.

27 Claims, 18 Drawing Sheets

SEMICONDUCTOR LIGHT EMITTING DEVICE HAVING A PROTECTING DEVICE

BACKGROUND OF THE INVENTION

This invention relates to semiconductor light emitting devices of a lamp or chip type. More particularly, this invention relates to a semiconductor light emitting device provided with a protecting element for protecting a light emitting element chip from being damaged by reverse voltages or the like, even where the light emitting element is applied by reverse voltages or high forward voltages.

The conventional semiconductor light emitting devices have been structured by a p-n junction having a direct junction between a p-type layer and an n-type layer or a doublehetero junction having an active layer sandwiched between p-type and n-type layers, so that light can be emitted by the p-n junction or the active layer by applying a forward voltage to between the p-type and n-type layers.

The lamp-type light emitting device, as shown in FIG. 30, includes a light emitting chip (hereinafter referred to as "LED chip") 3 with semiconductor layers that is die-bonded on a curve-surfaced recess portion provided at a tip of a first lead 1. The LED chip has one electrode formed at its bottom face electrically connected to the first lead 1 and the other electrode formed at its top face electrically connected to a second lead 2 via a gold wire 4 or the like. These elements are molded by a resin package 6 transperent for the light emitted by the LED chip 3.

Meanwhile, the chip-type light emitting device, as shown in FIG. 31, is widely used as a light emitting source for portable appliances, such as handy telephones and PHSs, that have to be made small in sized and light in weight. That is, the device has a base plate 91 having terminal electrodes 92, 93 formed at respective end portions thereof. One of the terminal electrodes 92 has an electrode portion connected thereto to have an LED chip 3 die-bonded thereon so that a bottom electrode of the LED chip is directly connected with the terminal electrode 92. The LED chip 3 also has a top electrode wire-bonded to the other terminal electrode 93 via a gold wire 4. Thus, electrical connections between the electrodes are made. The base plate 91 is molded on a main surface side so as to encapsulate the LED chip 3, the gold wire, and so on, thus forming a package 95.

These light emitting devices are of a diode structure so that they have no electric current therethrough where a reverse voltage is applied thereto. There is an adopted method of usage utilizing such a rectifying function, wherein an A.C. current, instead of a D.C. current, is applied to the device so as to allow an electric current to flow therethrough only while a forward voltage by the A.C. current is applied.

The usual semiconductor light emitting chip generally employs a compound semiconductor based on such as GaAs, GaP and gallium-nitride. However, where such a compound semiconductor is used, the resulting chip is less resistive to reversely applied voltages and accordingly susceptible to suffer damages in its semiconductor layers. In particular, where using a gallium-nitride based compound semiconductor having a high bandgap energy, the device has a higher operating voltage as compared to a device with a GaAs chip. Further, the device has a low withstand voltage with respect to reverse voltages and is susceptible to suffer damages due to the reversely applied voltage. Thus, there is a problem that the device is damaged or deteriorated of characteristics by applying an A.C. voltage On the other hand, even where no A.C. voltage is applied for driving the device, there is also a problem that when a high voltage such as a surge voltage is externally applied, there is a possibility that the compound semiconductor junction be damaged even if the voltage is in a forward direction.

SUMMARY OF THE INVENTION

It is a primary object of the present invention to provide a semiconductor light emitting device which hardly suffers from damages even where a reverse voltage is applied, through A.C. driving, to between a p-side electrode and an n-side electrode of the semiconductor light emitting device.

It is another object of the present invention to provide a semiconductor light emitting device which hardly suffers from damages even where an external large input such as a surge is applied in a forward direction.

It is further object of the present invention to provide a semiconductor light emitting device which has a concrete structure of incorporating a protecting element in the semiconductor light emitting device such that almost no effect is given upon the performance and manufacturing cost for the conventional light emitting device, without increasing the overall area of the conventional light emitting device or weakening the brightness thereof.

It is yet another object of the present invention to provide a semiconductor light emitting device which is capable, even where a protecting element for protecting a light emitting element chip is provided on an end side of a lead, of protecting the protecting element from corrosion or deteriorating due to impurities intruding through the lead.

It is still further object of the present invention to provide a semiconductor light emitting device which is made in a small one chip form that hardly suffers damages even when applied by reverse voltages.

It is another object of the present invention to provide a concrete structure where a light emitting portion is added with a protecting element within one chip.

A semiconductor light emitting device according to the present invention is structured by incorporating therein with:

(a) a light emitting portion formed by semiconductor overlying layers including a first conductivity layer and a second conductivity layer in order to form a light emitting layer; and (b) a protecting element portion provided in electrical connection between the first conductivity type layer and the second conductivity type layer so that the light emitting portion is protected against at least a reverse voltage applied to the light emitting portion.

Here, the first conductivity type and the second conductivity type each mean that, when one of the polarities of an n-type and a p-type is taken as a first conductivity type, the other p-type or n-type is a second conductivity type. Also, the protecting element means an element that can short-circuit a reverse voltage applicable to the light emitting element chip or short a forward voltage greater than a predetermined voltage that is higher than the operating voltage of the light emitting element chip, and includes a zener diode, a diode-connected transistor, an element having a MOSFET with its gate short-circuited to a source or drain thereof, a composite element thereof, and an IC.

With this structure, even if a reverse voltage is applied to the opposite conductivity type semiconductor layers of the light emitting portion, an electric current easily flow through the protecting element portion so that no high reverse voltage is applied to the light emitting portion. If this protecting element portion employs, for example, an ordinary diode using a silicon semiconductor, the forward voltage of the silicon diode (the voltage at which a current begins to flow due to an applied forward voltage) can be suppressed at approximately 0.6 V. Consequently, the light emitting portion has almost no reverse voltage applied, immediately releasing the reverse voltage. Meanwhile, it is possible to make the light emitting portion and the diode portion in one chip by using a same semiconductor material as the light emitting portion. Further, if a zener diode is used, the zener characteristics give no effects upon usual operation and protect when a high forward voltage due to a surge is applied.

If the abovestated light emitting portion and the protecting element portion are formed by a separate chips (elements), a lamp-type or chip-type light emitting device can be provided as stated hereinbelow. That is, a lamp-type light emitting device is provided by further providing with first and second leads, wherein the light emitting element chip being mounted on a tip of the first lead, an electrode connected to the first conductivity type layer of the light emitting element chip being electrically connected to the first lead, an electrode connected to the second conductivity type layer of the light emitting element chip being electrically connected to the second lead, the protecting element being mounted on one of the first and second leads and electrically connected between the first and second leads so as to protect the light emitting element chip. More specifically, a recess portion having a curved surface is formed at a tip of the first lead to mount the light emitting element chip on a bottom surface of the recess portion, and a flange being provided at one part in an upper surface of the recess portion to provide the protecting element on a surface of the flange.

The second lead may have a separating groove separating the tip of the second lead into two regions, the electrode connected to the second conductivity layer of the light emitting element chip being electrically connected to one region of the second lead, the protecting element being mounted on the other region at the tip of the second lead. With this structure, there is almost no possibility of incurring troubles in wire bonding due to the die-bonding material used for the protecting element.

The first and second leads may be of a sheet member, a recess portion having a curved surface being formed at a tip of the first lead, the light emitting element chip being mounted on a bottom surface of the recess portion, one of the first and second leads has a flat portion at a lateral surface thereof on which the protecting element is bonded. With this structure, the protecting element can easily be incorporated in the lamp-type semiconductor light emitting device without any change to the light emitting portion as conventionally is.

The protecting element may be encapsulated by a thermal resistive encapsulating material and a package encapsulating the light emitting element chip being provided to cover the thermal resistive encapsulating material. By doing so, the protecting element is firmly molded by the thermal resistive resin and hardly suffers corrosion or damages, even if a gap occurs between the lead and the resin package due to temperature rise during soldering at the lead tip or the like.

A thermal resistive encapsulating material may be provided covering at least parts of the first and second leads at position of the first and second leads reverse to a side of providing the light emitting element chip rather than a position of providing the protecting element, and the package encapsulating the light emitting element chip being provided so as to cover the thermal resistive encapsulating material. With this structure, even if impurities intrude, it is blocked from intruding by the thermal resistive encapsulating material, and accordingly the protecting element and the light emitting element chip can be prevented therefrom.

The first and second leads may be provided in parallel with each other to have a recess portion having a curved surface provided in a continuous manner at the tips of the first and second leads, the light emitting element chip being mounted in the recess of the first lead, the protecting element being mounted in the recess of the second lead. Further, a recess provided at the tip of the first lead may be formed in a recess oval in plan to have a curved surface, the light emitting chip and the protecting element provided side by side in the recess.

With these structures, the protecting element is mounted, together with the light emitting element chip, in the recess portion having a curved surface so that they are placed at locations close to each other at almost a same height level. Therefore, die-bonding and wire-bonding can be carried out at the same time for the light emitting element chip and the protecting element, without increasing the manufacturing process steps. Further, the wire-bonding within the common recess facilitates wire-bonding. If the recess portion is formed in both the first and the second leads in a continuous manner, there is no necessity of performing wire-bonding crossing over a lateral wall of the recess portion, eliminating the possibility of contact between wires. Further, since the reflected light by the wide recess portion can be entirely utilized for radiation, the protecting element can easily be incorporated in a lamp-type semiconductor light emitting device without giving any change to the light emitting portion as conventionally is.

The protecting element may be provided such that a surface of the protecting element is lower than a surface of the light emitting element chip. With such structure, the light radiating efficiency is preferably improved since the light laterally emitted by the light emitting element chip can be reflected upward by the inner wall of the recess portion.

The protecting element may be bonded such that electrodes thereof are respectively in direct electrical connection to the first and second leads. With this structure, since the protecting element is bonded sandwiched between the leads constituting the light emitting element, there is no necessity of performing wire-bonding and a space for mounting the protecting element. Accordingly, it is possible to easily provide a lamp-type semiconductor light emitting device incorporating with a protecting element while forming the light emitting portion in the same structure as the conventional one without affecting on the light emitting characteristics and mounting up of cost.

One of the first and second leads may have a projecting portion formed at an opposing lateral wall, the protecting element being bonded between the projecting portion and the other of the first and second leads. With this structure, it is possible to mount the protecting element simply and positively.

The light emitting element chip may have an n-side electrode and p-side electrode on one surface side and a substrate on the other surface side of a material transmissible of the light emitted thereby, the protecting element has two electrodes provided on one surface side thereof so as to be directly connected respectively with the n-side electrode and p-side electrode of the light emitting element chip, the light emitting element chip being bonded on the protecting element in a structure for radiating light through the substrate of the light emitting element chip such that the n-side electrode and the p-side electrode are respectively connected with the two electrodes of the protecting element.

In a concrete structure form, a recess portion having a curved surface may be formed in the first lead, the protecting element at the other surface is adhered to the recess portion. Otherwise, the protecting element at the other surface may be adhered to an chip-type insulating base plate having at opposite end portions terminal electrodes.

A chip-type insulating base plate having first and second terminal electrodes at opposite end portions may be further provided, the light emitting portion and the protecting element being respectively a light emitting element chip and a protecting element separated from each other, the light emitting element chip and the protecting element being mounted directly on the insulating base plate or the terminal electrode, an electrode of the light emitting element chip connected to the first conductivity layer thereof being electrically connected with the first terminal electrode, an electrode of the light emitting element chip connected to the second conductivity layer thereof being electrically connected to the second terminal electrode, the protecting element being electrically connected between the first and second terminal electrodes so as to protect the light emitting element chip. With this structure, a chip-type light emitting device is available wherein the light emitting element chip is protected. Here, the terminal electrodes includes the entire metal portion integrally formed with the connected electrode portion connected to a circuit board or the like on which the light emitting element is built.

In this case, both the light emitting element chip and the protecting element may be mounted on one of the first and second terminal electrodes. Otherwise, the light emitting element chip and the protecting element may be separately mounted on one of the first and second terminal electrodes. In the latter structure, since the LED chip comparatively large in chip area is mounted on the first terminal electrode with the protecting element mounted on the second terminal electrode, the chip-type light emitting device has the LED chip arranged at almost the central position thereof while incorporating the protecting element therein.

The first and second terminal electrodes may have respective opposite ends defining a given gap therebetween, the electrodes of the light emitting element chip and the electrodes of the protecting element respectively in direct connection with the first and second terminal electrodes. With this structure, both the LED chip and the protecting element are both in direct connection with the first and second terminal electrodes, thus eliminating the necessity of wire-bonding. Consequently, the chip-type light emitting device is very thin because there is no necessity of a space for providing wires above the LED chip. Nevertheless, the incorporation of the protecting element in the device hardly suffers damages due to reverse voltages and static electricity surges.

The light emitting portion and the protecting element portion may be formed on a same substrate, a chip of a semiconductor light emitting device incorporating the protecting element portion for protecting the light emitting portion being formed by one chip. The protecting element portion may be of a diode structure having semiconductor layers including an n-type region and a p-type region in order to form a diode. With this structure, the light emitting portion and the protecting element can be formed in parallel connection and reverse in polarity within one chip. Accordingly, the light emitting device can be assembled as it is in a light emitting lamp or chip-type light emitting device, wherein, where a reverse voltage is applied to the light emitting portion, such voltage is in forward direction for the diode portion so that an electricity flows through the diode portion and the light emitting portion has no high reverse voltage applied thereto.

The n-type region and the p-type region of the diode structure may be formed by semiconductor overlying layers. Or, at least one of the n-type region and the p-type region of the diode structure may be formed by introducing an impurity into the other conductivity type of the semiconductor layer. The diode structure, where it is formed in a layered structure, may be a doublehetero structure having a sandwiched semiconductor layer with low bandgap energy. The doublehetero structure can provide a high performance diode with low forward voltages.

The light emitting portion may be formed by semiconductor overlying layers including an n-type layer and a p-type layer to form a light emitting layer, the electrical connection between the n-type layer of the light emitting portion and a p-type region of the diode structure and/or the p-type layer of the light emitting portion and the n-type region of the diode structure is performed through an interconnect laid on an insulating film provided on the semiconductor overlying layers. With this structure, the electrical connections are easy and positive to carry out. Further, the electrical connections are possible without performing wire-bonding on wire-bonding electrodes (pads) provided on the semiconductor layer (region), simplifying the manufacture process and reduce the chip size. However, electrodes (pads) may be provided for each portion to give electrical connections through wire-bonding.

The electrode of the light emitting portion connected with the n-type layer and/or the p-type layer thereof is provided on the p-type region and/or the n-type region of the diode structure. With this structure, there is no necessity of providing a wire-bonding electrode for the light emitting portion so that the light emitted by the light emitting layer can be radiated without shield, improving the light radiating efficiency, i.e. the efficiency of radiation of the light outwardly radiated.

The n-type layer and p-type layer of the light emitting portion as well as the p-type region and the n-type region of the diode structure may have respective electrodes which are connected through wire-bonding.

Further, the light emitting portion may be formed by semiconductor overlying layers including the first conductivity type layer and the second conductivity type layer to form a light emitting layer, the protecting element portion comprising a diode portion formed, in order, by a second conductivity type region by introducing an impurity into the first conductivity type layer exposed by removing part of the semiconductor overlying layers and a first conductivity type region, an electrode being provided on the exposed first conductivity layer in a manner extending over the second conductivity type region, and electrodes being provided respectively connected to the second conductivity type layer of the semiconductor overlying layer and the first conductivity type region of the diode portion. With this structure, the first conductivity type layer of the light emitting portion and the second conductivity type portion of the diode portion can be connected by one common electrode at a same time.

Where the light emitting element chip is of a gallium-nitride based compound semiconductor that is weak against reverse voltages or high forward voltages, the resulting semiconductor light emitting device, if structured above, is preferably protected against the reverse voltages or the surges. Here, the gallium-nitride based compound semiconductor refers to a semiconductor of a compound containing a Group-III element Ga and a Group-V element N, wherein part of the Group-III element Ga may be replaced by other Group-III elements such as Al and In and/or part of the Group-V element N may be replaced by other Group-V elements such as P and As.

For a fuller understanding of the nature and advantages of the invention, reference should be made to the ensuing detailed description taken in conjunction with the accompanying drawings.

DETAILED DESCRIPTION

Figure 1:
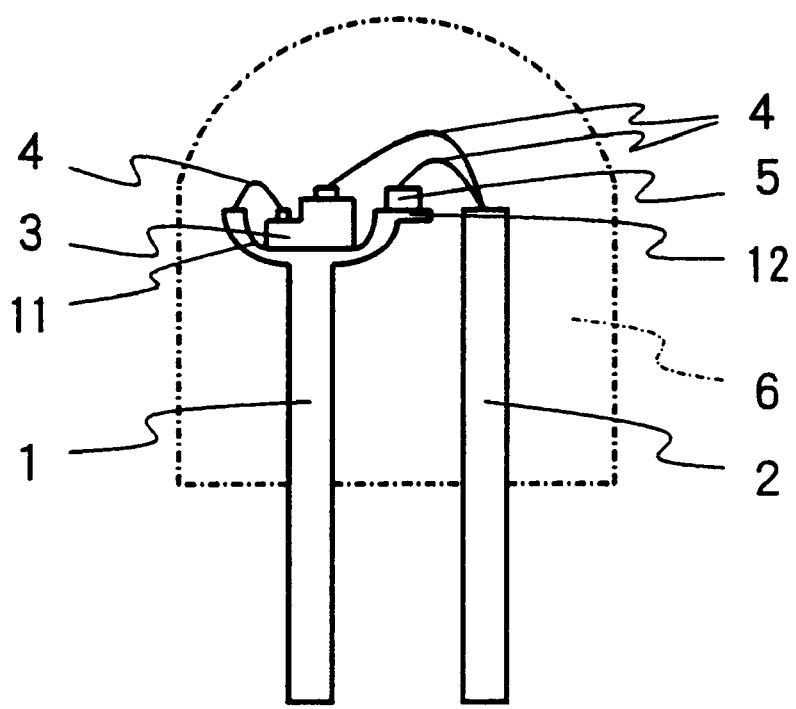
FIGS. 1(a) to 1(b) respectively are sectional and plan explanatory views of a semiconductor light emitting device according to one embodiment of the present invention.
Figure 1:
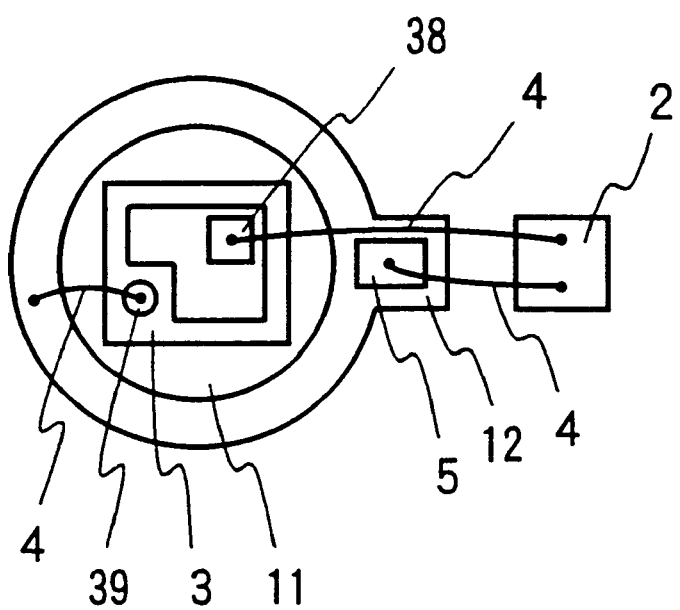

Referring to FIGS. 1(a) and 1(b), there are illustrated a sectional explanatory view and a plan explanatory view of a semiconductor light emitting device according to the present invention. The semiconductor light emitting device has a first lead 1 having a recess portion 11 formed curving around at a tip thereof so that an LED 3 is die-bonded on the recess portion 11. The LED 3 has one electrode, e.g. an n-side electrode, 39 electrically connected to the first lead 1 and another electrode, e.g. a p-side electrode, 38 electrically connected to a second lead 2 via a gold wire 4. The first electrode 1 has a protecting element (hereinafter referred to as a protecting diode chip) 5 as a protecting element die-bonded on a flange 12 formed at the tip of the first lead 1. The protecting diode chip 5 has its positive electrode (i.e. an electrode connected to a p-type layer) electrically connected to the first electrode 1 and a negative electrode (i.e. an electrode connected to an n-type layer) electrically connected via a gold wire 4 to the second electrode 2. These elements are encapsulated by a resin package 6.

Figure 2:
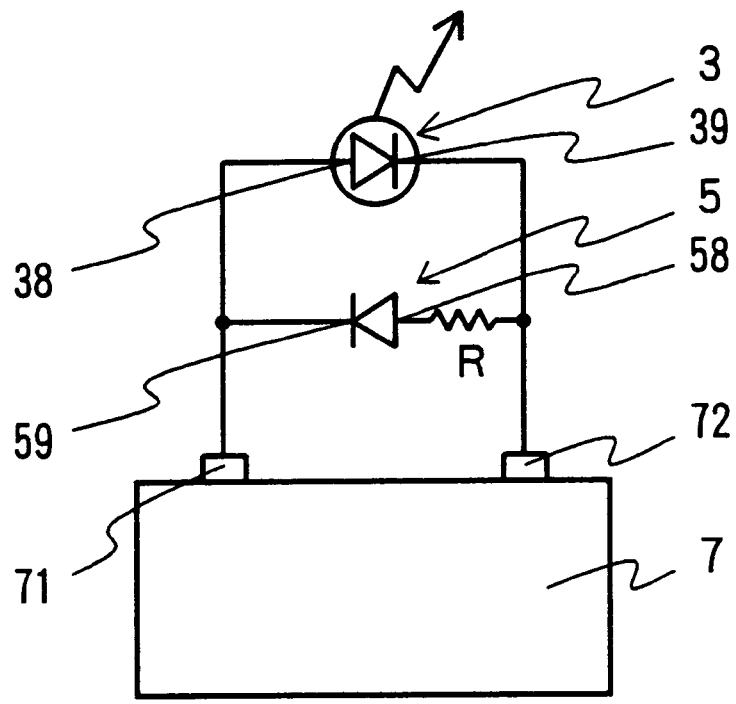
FIG. 2 is an equivalent circuit diagram showing a connection relationship between a light emitting portion and a diode portion of FIG. 1.

Referring to FIG. 2, there is shown a circuit connection as an equivalent circuit between the LED chip 3 and the protecting diode chip 5 together with a power source 7. In the semiconductor light emitting device of the invention, the p-side electrode 38 of the LED chip 3 is electrically connected to the negative electrode 59 of the protective diode chip 5, while the n-side electrode 39 of the LED chip 3 is electrically connected to the positive electrode 58 of the protective diode chip 5 via a resistance R. The electrodes of the LED 3 and the diode are connected to respective electrode terminals 71, 72 of the power source 7. Incidentally, although the resistance R is omitted in FIG. 1, it is preferably provided to have a role of bearing voltage drops when a forward or backward overvoltage is applied.

The resistance R may be provided on an negative electrode 59 side of the protecting diode chip 5.

Figure 3:
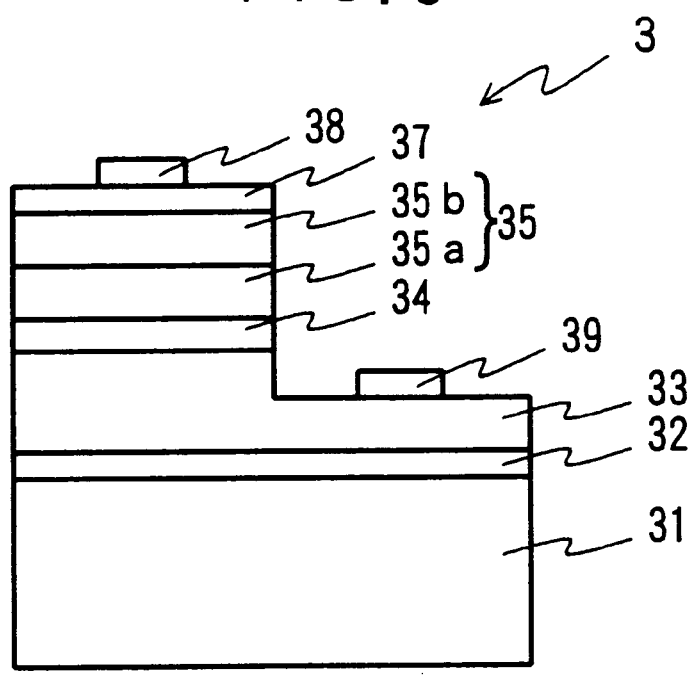
FIG. 3 is a sectional explanatory view of an LED chip of FIG. 1.

The LED chip 3 is formed to emit bluish light (ultraviolet ray to yellow light) as exemplified in a sectional view of FIG. 3. That is, the LED chip 3 includes a substrate 31, for example, of a sapphire ($Al_2O_3$ single crystal). On a surface of the substrate 31 are formed, in order, a buffer layer 32 of GaN in a layer thickness of approximately 0.01–0.2 μm, an n-type layer 33 for a cladding layer in a layer thickness of approximately 1–5 μm, an active layer 34 of an InGaN-based (meaning a chemical composition having a variable ratio of In and Ga) compound semiconductor in a layer thickness of approximately 0.05–0.3 μm, and a p-type layer (a cladding layer) 35 having an AlGaN-based (meaning a chemical composition having a variable ratio of Al and Ga) compound semiconductor sublayer 35a and a GaN sublayer 35b in a layer thickness of approximately 0.2–1 μm. Further, a p-side electrode 38 is formed on the p-type layer 35 through a current diffusing layer 37. Meanwhile, an n-side electrode 39 is formed on the n-type layer 33 at a location exposed by partly removing the semiconductor overlying layers 33 to 35.

The protecting diode chip 5 is a diode formed of a ordinary silicon semiconductor to have a p-n junction. The p-n junction may be formed by epitaxially growing, on one conductivity type semiconductor layer, the other conductivity type semiconductor layer, or otherwise introducing, into one conductivity type semiconductor layer, an impurity of the other conductivity type, for example, through diffusion. Alternatively, the semiconductor material may be a compound semiconductor in place of silicon. In such a case, the diode may be formed in a hetero p-n junction structure or a doublehetero junction structure. The doublehetero junction, if employed, serves to lower the forward voltage level. The shape of the diode chip may be in a cylindrical form, a rectangular form, or others. Meanwhile, if the positive electrode and the negative electrode are provided on a common plane, the diode can be connected to the LED chip side-by-side through bumps, while if these electrodes are provided on vertically separate planes, the diode can be conveniently die-bonded together with the LED chip onto a die pad through a bonding material.

In the present embodiment, the LED chip 3 and the protecting diode chip 5 are respectively die-bonded through an adhesive such as a silver paste onto the curved-planed recess portion 11 and the flange 12 of the first lead 1, as shown in FIG. 1. As stated before, the n-side electrode 39 and the p-side electrode 38 of the LED chip 3 are electrically connected via the gold wire 4 to the first lead 1 and the second lead 2, while the negative electrode of the protective diode chip 5 is electrically connected to the second lead via the gold wire 4. Note that the positive electrode of the protecting diode chip 5 is electrically connected at its bottom surface with the first lead 1 through an electrically conductive adhesive. These elements are molded by a transparent or milky-white epoxy resin that allows transmission of the light emitted by the LED chip 3, thus providing a semiconductor light emitting device encapsulated by a package 6 according to the present invention. By forming the package 6 in a dome shape as shown in FIG. 1, a lamp type light emitting device is available.

In the semiconductor light emitting device of the present invention, the protecting diode chip 5 is connected through the resistance R in parallel with the LED chip 3 so as to have polarities reversal to those of the LED 3. Consequently, even if an A.C. power source is employed for the power source 7 for driving the LED chip 3, when the A.C. voltage applied to the LED chip 3 is forward in phase, the protecting diode chip 5 has no current with the reverse voltage so that the LED chip 3 has a flowing current to thereby emit light. Meanwhile, the A.C. voltage applied to the LED chip 3 is reverse in phase, the protecting diode chip 5 has a current passing therethrough. Accordingly, even when the A.C. voltage applied to the LED chip 3 is reverse in phase, the LED chip 3 is not applied by a reverse voltage higher than the forward voltage for the protective diode chip 5. Therefore, even if the LED chip 3 is weak against reverse voltages, the LED chip 3 does not suffer from excessively high reverse voltage. There is no fear that the LED chip 3 is damaged or deteriorated by high reverse voltages. Where a D.C. power source is used for driving the LED chip 3, if a surge reverse voltage is externally applied, it is discharged through the protective diode chip 5 so that the LED chip 3 is protected from suffering the reverse high voltage.

Figure 4:
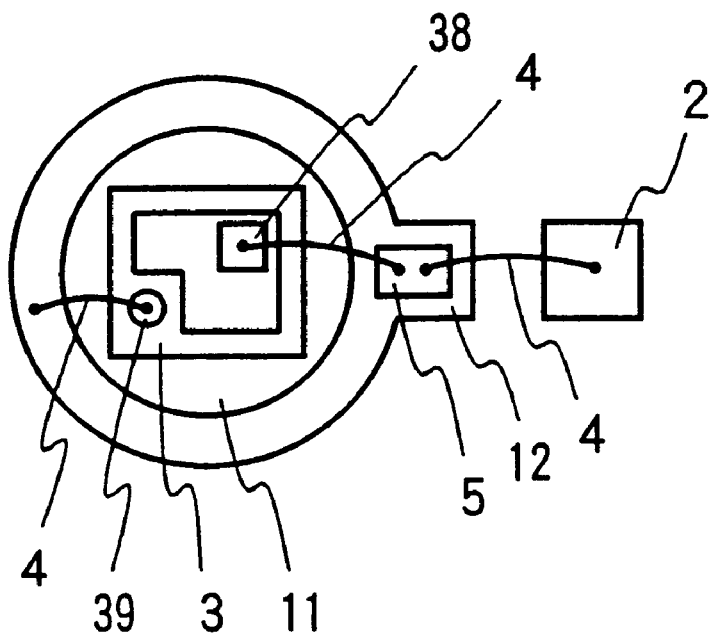
FIGS. 4(a) to 4(b) are plan explanatory views showing a modification to the FIG. 1 embodiment.
Figure 4:
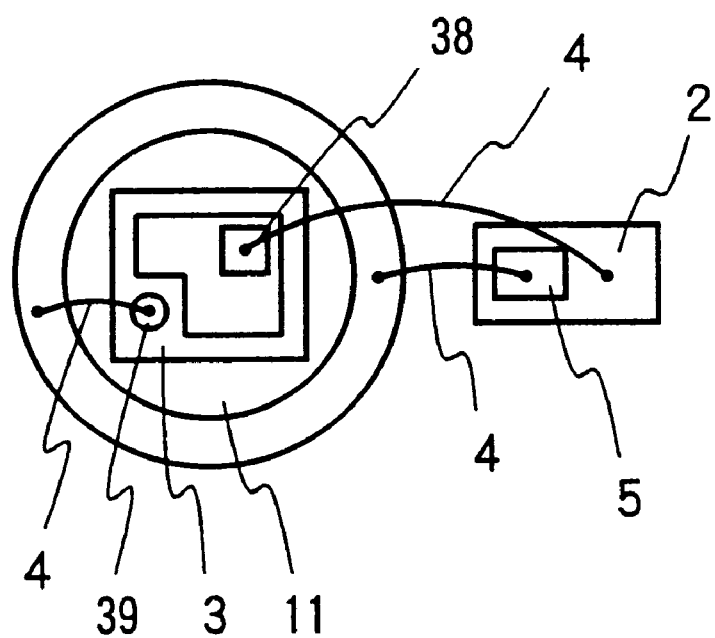

Since the present invention is characterized by the LED chip 3 and the protecting diode chip 5 which are connected in parallel with and reverse in direction each other, the way of connection can be modified in various manner. If, as shown in FIG. 4(a), the p-side electrode 38 of the LED chip 3 are connected via a gold wire 4 to the negative electrode of the protective diode chip 5 and further the negative electrode of the protective diode chip 5 is connected via a gold wire 4 to the tip of the second lead 2, it is possible to shorten the total length of the gold wires. Also, as shown in FIG. 4(b), the protective diode chip 5 may be bonded onto the tip of the second lead 2 and the respective electrodes be electrically connected through gold wires. With this structure, there is no necessity of increasing the tip portion area to an unnecessary extent. Incidentally, the same or similar parts or elements in FIGS. 4(a) and 4(b) are denoted by the same reference characters as those of FIGS. 1(a) and 1(b).

Figure 5:
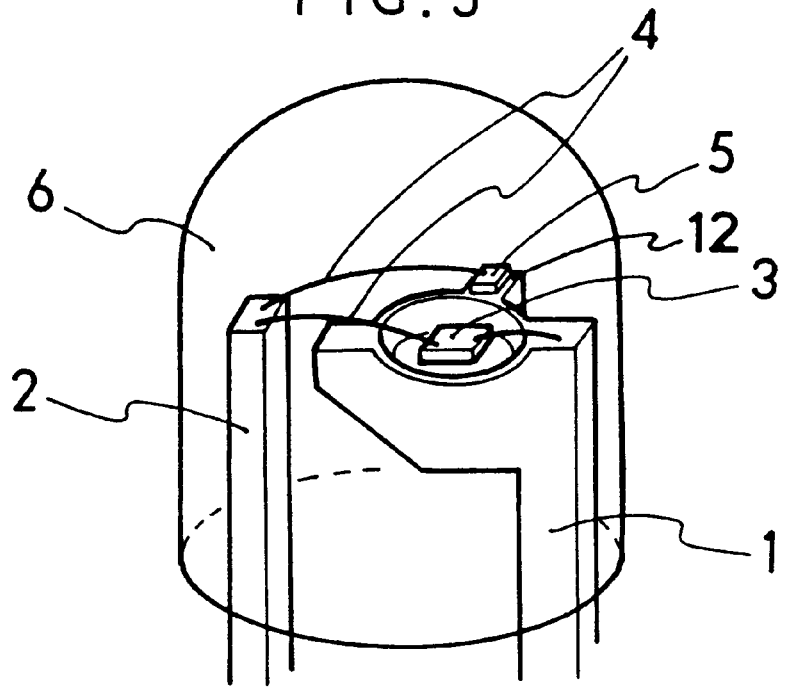
FIG. 5 is a perspective explanatory view showing a further modification to the FIG. 1 embodiment.
Figure 6:
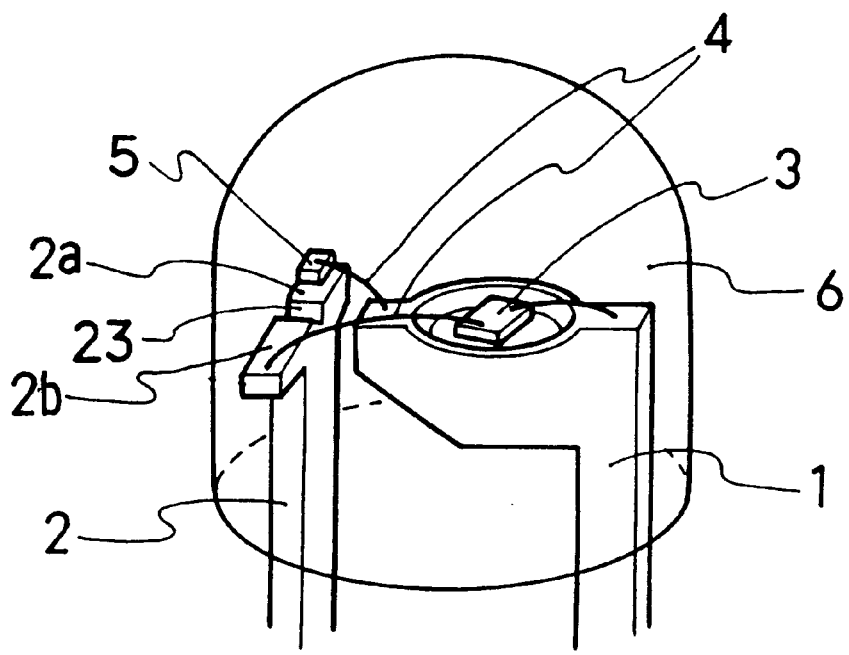
FIG. 6 is a perspective explanatory view showing further modification to the FIG. 1 embodiment.

Referring to FIG. 5 and FIG. 6, there are shown further modifications to the embodiments of FIGS. 4(a) and 4(b). This modification has the protecting diode chip 5 mounted on a surface of a flange 12 formed at a location deviated from a line connecting between the first lead 1 and the second lead 2, instead of providing the flange 12 on the first lead at a location close to the second lead as shown in FIG. 1. By providing the flange 12 at a deviated location from the second-lead facing position, there is less possibility of overlapping or crossing of the wires, thus preventing against wire contact. That is, the flange 12 for mounting with the diode chip 5 may be provided at any recess portion 11 around position at the tip of the first lead 1.

The modification of FIG. 6 is a modification to the embodiment of FIG. 4(b). That is, this modification has a diode chip 5 mounted on the second lead 2. More specifically, a groove 23 is formed in a top surface of the second lead 2 to divide the top surface into two areas 2a, 2b so that the protecting diode chip 5 is mounted on one area 2a and wire bonding is made on the other area 2b to the LED chip 3. This is because of preventing a bonding material used for bonding the protecting diode chip 5 from spreading over the top surface of the lead 2 to have adverse affects on the reliability of wire bonding, where the protecting diode chip 5 has to be mounted on a narrow top surface of the second lead 2 and wire-bonded to the LED chip 3. In this structure, high reliability of wire bonding is available while mounting the protecting diode chip 5 on a narrow site.

Figure 7:
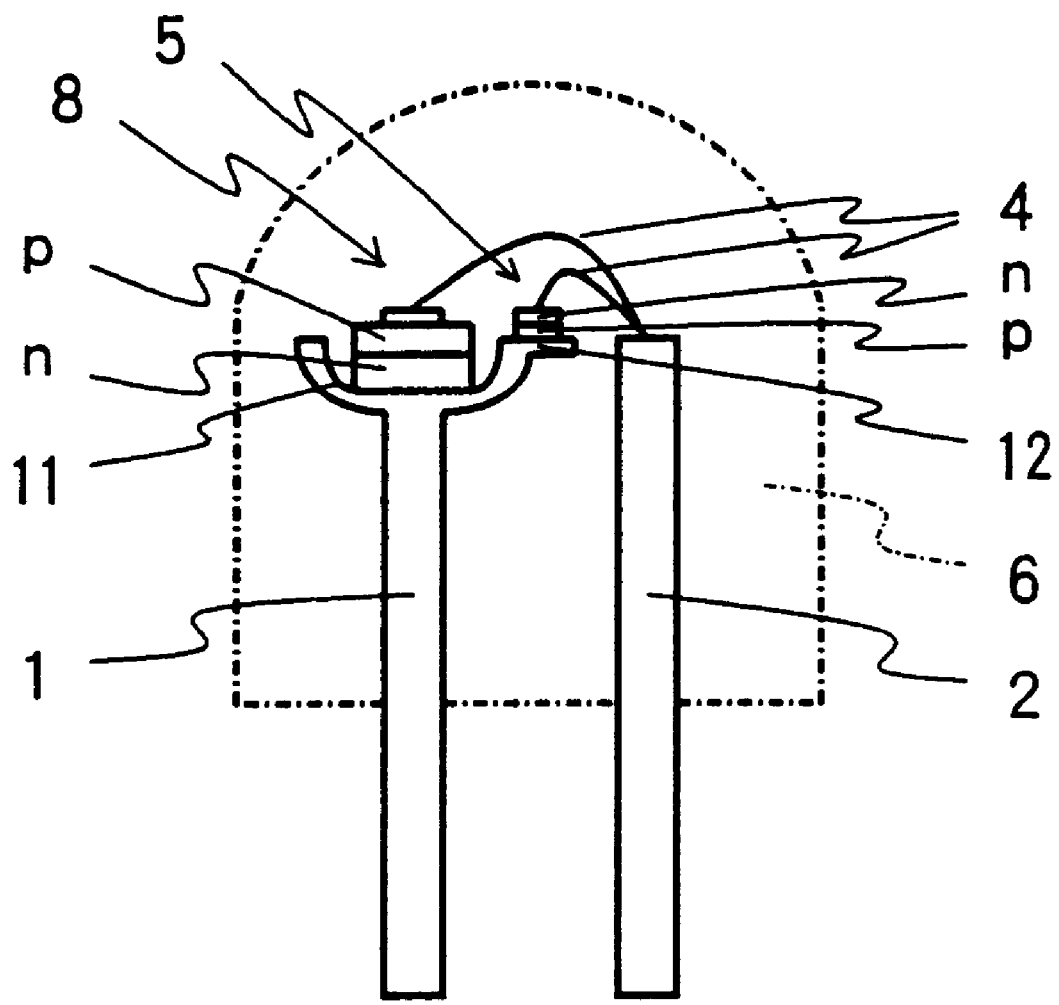
FIG. 7 is a sectional explanatory view of a semiconductor light emitting device according to another embodiment of the present invention.

Referring to FIG. 7, there is demonstrated a semiconductor light emitting device according to another embodiment of the present invention, wherein a substrate of an electrically conductive material is employed, e.g. for ruddy-light emitting LEDs. That is, an LED chip 8 has semiconductor layers of AlGaAs-based (meaning a chemical composition having a variable ratio of Al and Ga) compound semiconductors formed on a GaAs or GaP substrate, in place of the bluish-light emitting LED having gallium-nitride based semiconductor layers formed on a sapphire substrate. Other parts or elements than the above are similarly structured to the FIG. 1(a) embodiment, and the corresponding parts or elements to the FIG. 1(a) embodiment are denoted by the same reference character. In this embodiment, electrical connection is given between an n-side electrode of the LED chip 8 and the first lead 1 by merely bonding the LED chip 8 on the curve-surfaced recess portion 11 of the first lead 1 with using a silver paste or the like without performing wire bonding between the n-side electrode and the first lead 1. Thus a light emitting device lamp is provided that has the LED chip 8 and the protecting diode chip 5 connected in parallel therewith in a manner having a reverse polarity, similarly to the FIG. 1(a) embodiment.

Figure 8:
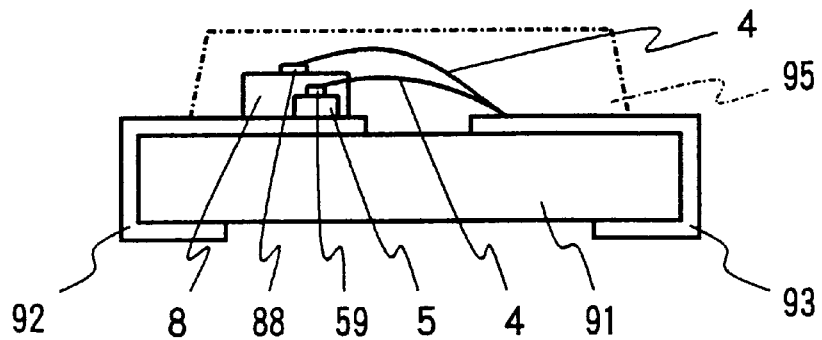
FIGS. 8(a) to 8(c) are sectional and plan explanatory views of a semiconductor light emitting device according to another embodiment of the present invention.
Figure 8:
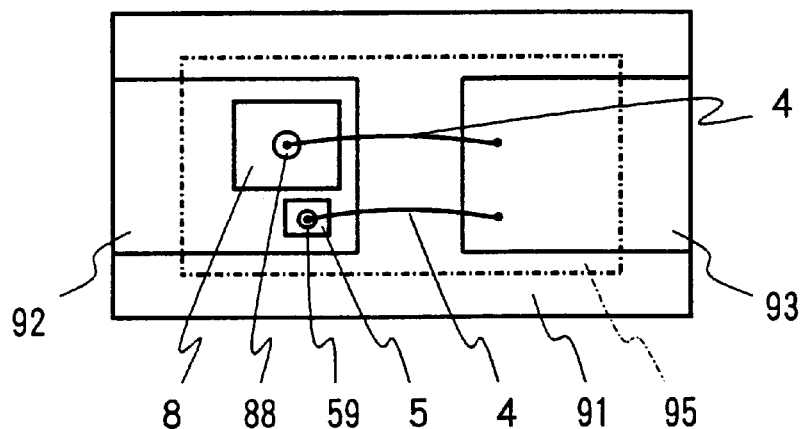
Figure 8:
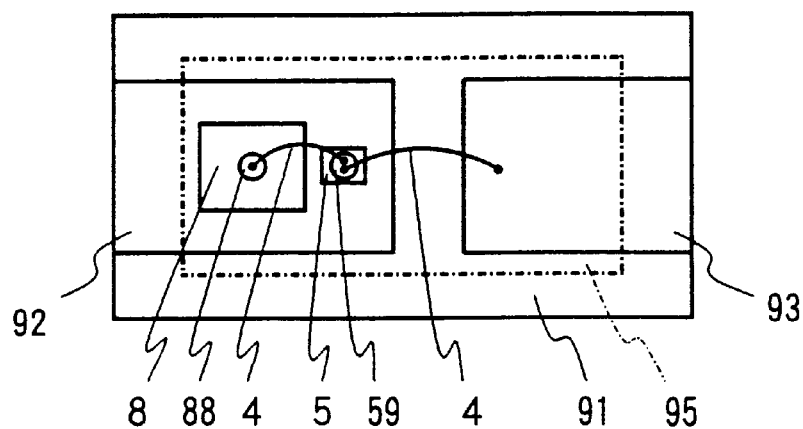
Figure 9:
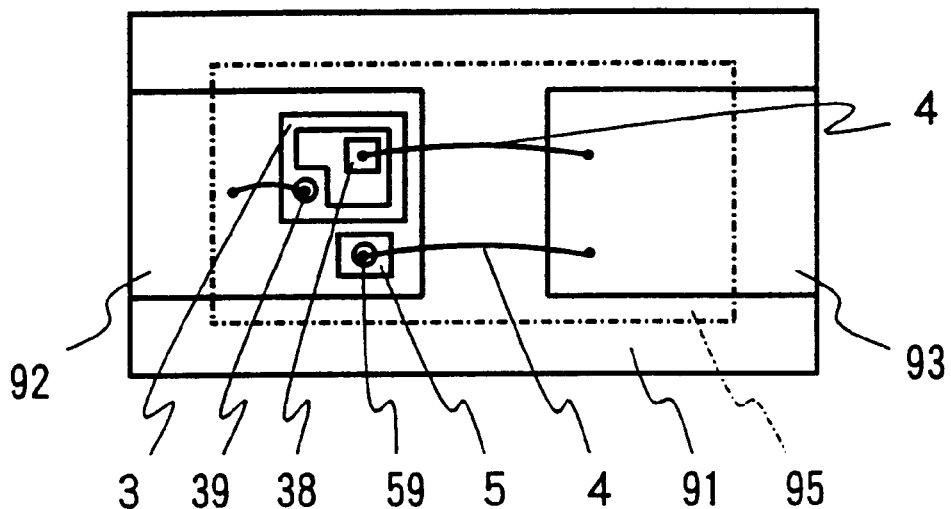
FIG. 9 is a plan explanatory view of a semiconductor light emitting device according to another embodiment of the present invention.

Referring to FIG. 8 and FIG. 9, there are shown embodiments of chip-type light emitting devices to which the present invention is applied, instead of the lamp type device. FIGS. 8(a) and 8(b) are a sectional explanatory view and a plan explanatory view of a chip-type light emitting device including, together with a protecting diode chip 5, an LED chip 8 having semiconductor layers formed on a substrate of an electrically conductive material such as GaAs. In FIGS. 8(a) and 8(b), an insulating base plate 91 is formed of ceramics or the like so that it has a first terminal electrode 92 on which an LED chip 8 and a protecting diode chip 5 are bonded side by side in electric connection at their one or bottom electrodes with the first terminal electrode 92. The other electrodes, i.e. a p-side electrode 88 of the LED chip 8 and a negative electrode 59 of the protecting diode chip 5, are electrically connected, by wire bonding, via gold wires 4 to a second terminal electrode 93. These elements on the base plate 91 are encapsulated by a light-transmitting material such as an epoxy resin forming a package 95 so that the light emitted by the LED chip 8 can be transmitted therethrough. Note that, if the first and second terminal electrodes 92, 93 are formed extending around to a backside of the insulating base plate 91, the resulting chip type light emitting device can be directly soldered on a circuit board.

In this chip-type light emitting device, there are no limitations as to the positions or the way of bonding the chips. For example, as shown in FIG. 8(c), if wire bonding is made such that the p-side electrode 88 of the LED chip 8 and the negative electrode 59 of the protecting diode chip 5 is first connected through a gold wire 4 and then the negative electrode 59 of the protecting diode chip 5 and the second terminal electrode 93 are connected through a gold wire 4, it is possible to reduce the total length of the gold wires used.

In FIG. 9, there is shown, similarly to FIG. 8(b), a plan explanatory view of a chip-type light emitting device mounting with an LED chip 3 having gallium-nitride based compound semiconductor layers formed on an insulating substrate such as a sapphire. In this example, no electrical connection is unavailable between one LED electrode, i.e. an n-side electrode 39, and the first terminal electrode 92 by merely bonding the LED chip 3 on the first terminal electrode 92. Consequently, wire boding is made for electrical connection between the n-side electrode 39 and the first terminal electrode 92 via a gold wire 4. Incidentally, it is possible in this case to mount the LED chip 3 directly on the insulating base plate 91. Other parts or elements than those stated above are similar to those of FIG. 8(b) and they are denoted by the same reference characters to omit explanations thereof.

Figure 10:
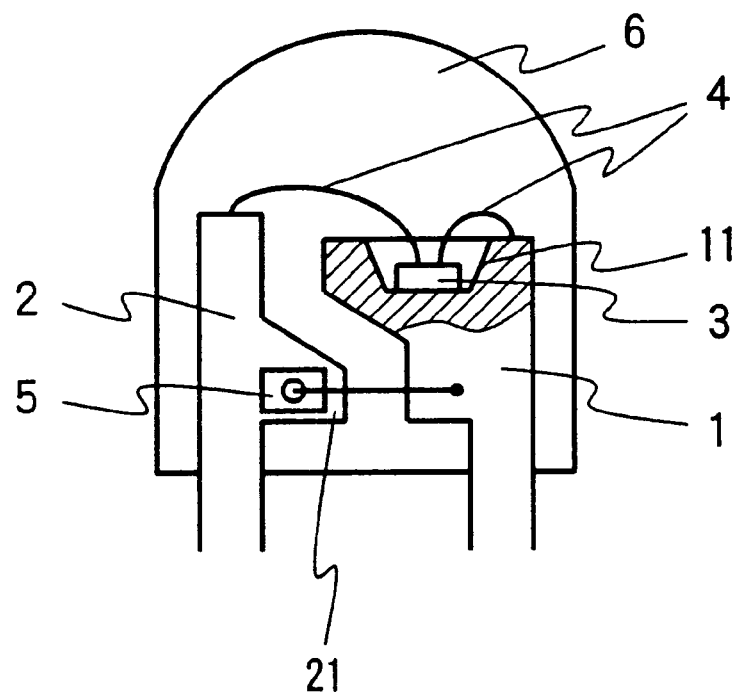
FIG. 10 is a sectional explanatory view of a semiconductor light emitting device according to another embodiment of the present invention.

Referring to FIG. 10, there is demonstrated another embodiment of a lamp-type light emitting device according to the present invention. This embodiment has a curved-surfaced recess portion 11 formed at the tip of the first lead 1 similarly to the FIG. 1(a) embodiment so that a bluish-light emitting LED chip 3 is bonded in the recess portion 11 with respective electrodes thereof electrically connected to the first and second leads 1, 2 through gold wires 4. In this embodiment, a zener diode chip 5 is bonded on a planar portion formed laterally projecting from the second lead 2 so that the zener diode chip 5 is electrically connected between the first and second leads 1, 2 to have a reverse polarity to that of the LED chip 3. Other structures are similar to the embodiment shown in FIGS. 1(a) and 1(b).

Although the first and second leads 1, 2 are similar to those of FIGS. 1(a) and 1(b), they are formed by press-punching a ferrous or copper sheet having a thickness of approximately 0.4–0.5 mm. The first lead 1 has at its tip a bawl-shaped recess portion 11 which is formed by press-stamping from the above of the first lead by using a conical punch. Because the recess portion 11 is thus formed by stamping, the first lead is cylindrically spread at its tip and left in an original sheet member form at a portion lower than the recess portion 11. In the FIG. 10 embodiment, the second lead 2 has a die-pad portion 21 formed in the flat portion at a position lower than the recess portion 11 of the first lead 11 so that a zener diode 5 can be die-bonded thereon. Note that the first lead 1 and the second lead 2, in a manufacturing stage, are connected with each other in a leadframe form.

Although the zener diode chip 5 has a similar function to the above-stated protecting diode chip, it is possible, by using the zener diode, to utilize the phenomenon that, when a great reverse voltage is applied to a p-n junction of a semiconductor chip with a high impurity concentration, electron is caused to flow through the p-n junction by tunnel effects. The voltage at which this reverse current begins to flow, i.e. zener voltage, can be determined by the concentration of impurity introduced. Therefore, if the zener voltage is determined at a predetermined voltage higher than the operating voltage of the LED chip 3 so that the LED chip 3 and the zener diode chip 5 are connected in parallel and in reverse polarity between the first and second leads 1, 2, the LED chip 3 is allowed to operate in a manner free from failure.

In order to manufacture a semiconductor light emitting device of this structure, an LED chip 3 is die-bonded onto a leadframe and wire-bonded therebetween with the leadframe vertically positioned. Then the leadframe is horizontally positioned to perform die-bonding and wire-bonding for a zener diode 5. Incidentally, the negative electrode (the electrode connected to the n-type layer) of the zener diode chip 5 is electrically connected directly with the second lead 2 through a conductive adhesive. The LED chip 3, if structured to have an n-side electrode and a p-side electrode at respective top and bottom surfaces thereof, is electrically connected at one electrode with the first lead 1 through a conductive adhesive due to die-bonding without the necessity of performing wire-bonding. Then these elements including the zener diode chip 5 are molded by a transparent or milky-white epoxy resin that is transmittable of the light emitted by the LED chip 3, thereby providing a resin package 6 in a manner similar to the embodiment of FIGS. 1(a) and 1(b).

In this embodiment, even if a reverse voltage is applied to the light emitting device, the LED chip does not suffer overburdening. Also, even if a static electricity is applied to the light emitting device, when the static electricity is in a reverse direction for the LED chip 3, the static electricity is discharged through the zener diode chip 5. When the static electricity is in a forward direction for the LED chip 3, if the voltage thereof is higher than the zener voltage, the static electricity is discharged through the zener diode chip 5, thereby protecting the LED chip 3. If the voltage of the static electricity is lower than the zener voltage, the electricity is discharged through the LED chip 3. In such a case, however, the voltage due to the static electricity is lower than the zener voltage, there is no fear of damaging the LED chip 3. Therefore, where the LED chip 3 is weak against reverse voltages or surge voltages, no excessively high voltage is applied to the LED chip 3, preventing the LED chip 3 from being damaged or deteriorated.

In the semiconductor light emitting device of this structure, since the zener diode chip 5 is provided on the flat portion of the sheet lead, there is no necessity of providing a zener diode space on a front side of the light radiating portion, avoiding the increase in the lamp package size. Further, the device is free from light shield due to wire bonding for the zener diode chip. Further, the zener diode can be mounted onto the flat portion of the lead with the lead horizontally positioned without the necessity of mounting the zener diode chip onto the tip of the lead with the lead vertically positioned. Accordingly, the die-bonding and the wire-bonding for the zener diode is easy to perform.

Incidentally, although in the embodiment of FIG. 10 the protecting element was provided on the second lead, it may be provided on the flat portion of the first lead to be wire-bonded to the second lead provided that the protecting element is connected to the first and second leads in a manner reverse to the LED chip. Further, the provision of the die-pad projecting portion is unnecessary on the lead, if the protecting element can be die-bonded in the lead width. Although the protecting element can be structurally provided outside the resin package instead of being molded within the resin package, it is preferred to encapsulate the protecting element using a thermal resistive encapsulating material as stated above in view of protecting the protecting element.

Figure 11:
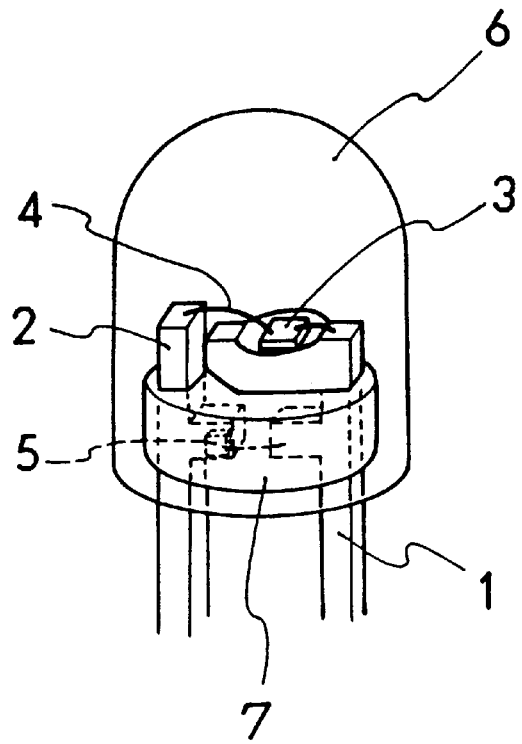
FIGS. 11(a) to 11(b) are perspective views of improvements on the FIG. 10 embodiment.
Figure 11:
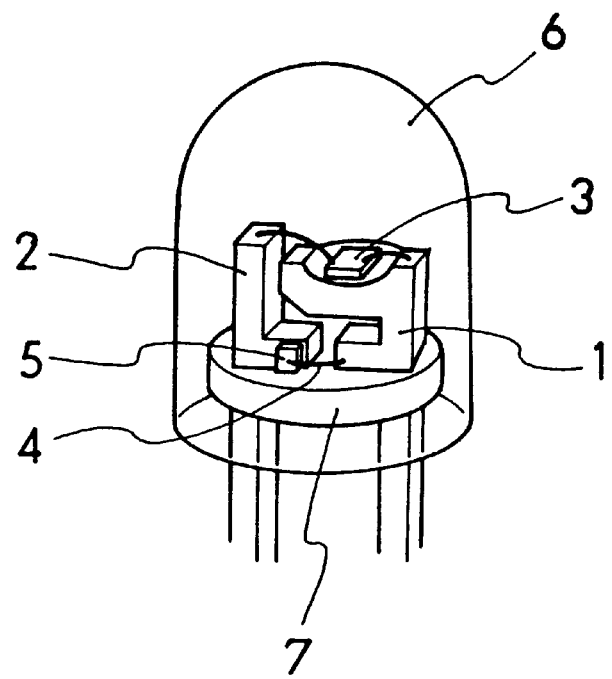

Referring to FIGS. 11(a) and 11(b), there is shown an embodiment improved over the FIG. 10 embodiment. Where the protecting element (zener diode chip) 5 is provided at a base portion of the lead as shown in FIG. 10, it is possible to protect the LED chip 3 without having any effect on the light radiating portion. However, during soldering the lead, the heat due to soldering is easily conducted through the base portion to the resin package 6. If the heat is conducted through the lead to the resin package 6, gaps are possibly caused between the lead 1, 2 and the package 6 due to low thermal resistance of package 6. If such gaps occur, impurity substances such as flux used for soldering may intrude therethrough to the protecting element 5, leading to corrosion or impair to the protecting element 5. The embodiments of FIGS. 11(a) and 11(b) is structured to solve such problems.

That is, in the FIG. 11(a) embodiment, the protecting element 5 is bonded onto the second lead 2 and wire-bonded to the first lead 1, and the protecting element 5 is encapsulated by a cylindrical heat-resistive member 7. The heat-resistive member 7 is of a molding resin such as an epoxy resin that is improved in thermal resistance by being mixed with fillers, which is formed into a desired shape through injection molding or the like. The heat-resistive member 7 is covered by the package 6 to protect the light emitting chip in a manner as stated hereinbefore.

In the FIG. 11(b) embodiment, the heat-resistive member 7 is provided such that it does not directly encapsulate the protecting element 5 but cover at least the first and second leads 1, 2 at a lower position (on a bottom side of the package 6 from which the leads extend outside). The heat-resistive member 7 will not be deteriorated by the raised temperature in the leads 1, 2 due to soldering or the like, and accordingly no gaps will be caused between the heat-resistive member 7 and the leads 1, 2. Consequently, there is no fear that impurity substances intrude through the lead toward the protecting element 5, thus protecting the protecting element 5, the LED chip 3, and the wire-bonded portions. Incidentally, in FIGS. 11(a) and 11(b) the corresponding parts or elements to those of FIG. 10 are denoted by the same reference characters, omitting explanations thereof.

In this manner, the protecting element is encapsulated by the heat-resistive member or the leads are covered by the heat-resistive member at a position closer to the base than the protecting element so that if stripping should occur between the lead and the resin package due to soldering temperature rise or the like, the heat-resistive member and the leads are firmly fixed therebetween to thereby prevent the impurity substances from intruding to the upward of the heat-resisting member. Thus, the protecting element is free from corrosion, improving reliability.

Although in the FIG. 11(b) embodiment the heat-resistive member was provided in a cylindrical form to cover the both leads, it is possible to cover the leads separately.

Referring to FIG. 12(a) and FIG. 12(b), there are shown a plan view and a sectional view according to another embodiment built with a protecting element 5. This embodiment includes a first and a second leads 1, 2 positioned in a pair manner so that the first and second leads 1, 2 have a curved-surfaced recess portion 17 cooperatively formed in a continuous manner at their tips. The recess portion 17 of the first lead 1 has an LED chip 3 die-bonded therein, and wire-bonded by gold wires 4 and molded into a package 6 in a manner similar to the FIG. 10 embodiment.

To form a bowl-shaped recess portion 17 for the leads 1, 2, a jig is inserted in a gap between the leads 1, 2 during stamp-forming the recess portion 17 so that the tips of the leads 1, 2 are outwardly spread into a curve-surfaced recess portion 17 in a manner continuous to each other without crushing their gap portions.

The recess portion 17 is provided in a manner continuous to the both leads, though it conventionally formed only in the first lead 1. Consequently, the recess portion is provided large without requiring increase in the spacing between the leads 1, 2, i.e. without increasing the size of the resin package 6. Other structures are similar to the above embodiment.

Figure 12:
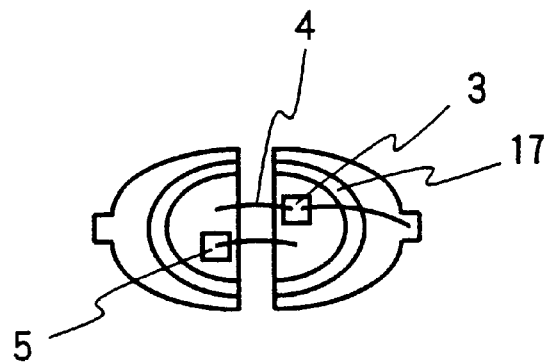
FIGS. 12(a) to 12(b) are plan and sectional explanatory views of semiconductor light emitting devices according to further embodiments of the present invention.
Figure 12:
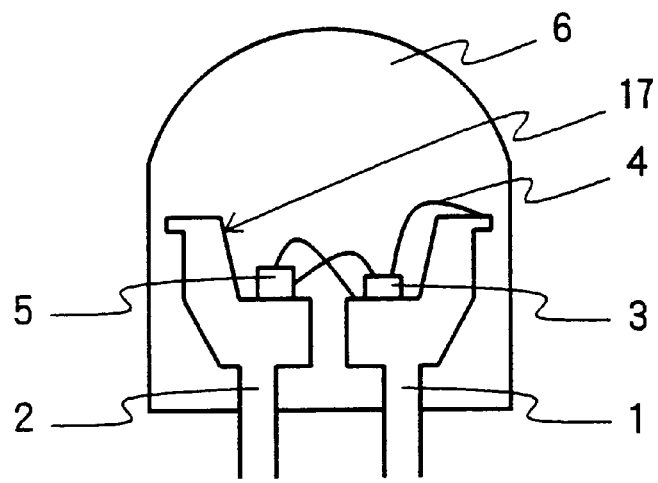
Figure 13:
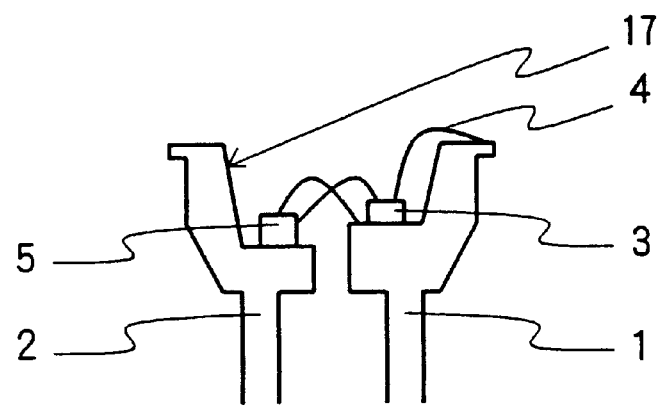
FIG. 13 is a sectional explanatory view showing a modification to the FIG. 12 embodiment.

In this embodiment, the recess portion 17 had its bottom at a same height in the first and second leads 1, 2. However, as show in FIG. 13, the recess portion 17 is preferably formed such that the bottom in the second lead 2 for providing he protecting element 5 is arranged low or the height of the protecting element 5 is lower than the height of the LED chip 3. By so constructing, the light portion laterally emitted from the LED chip 3 is effectively reflected upward by the inner wall of the recess portion 17. The bottoms of the recess portion 17, if provided a step therebetween, can be easily formed by using a stepped punch. Incidentally, the corresponding portions to those of FIG. 12 are denoted by the same reference characters. It is also possible to direct the light by coating the protecting element 5 portion with a reflective insulating material such as a white paint or applying such reflective material thereonto in a bawl shape.

Figure 14:
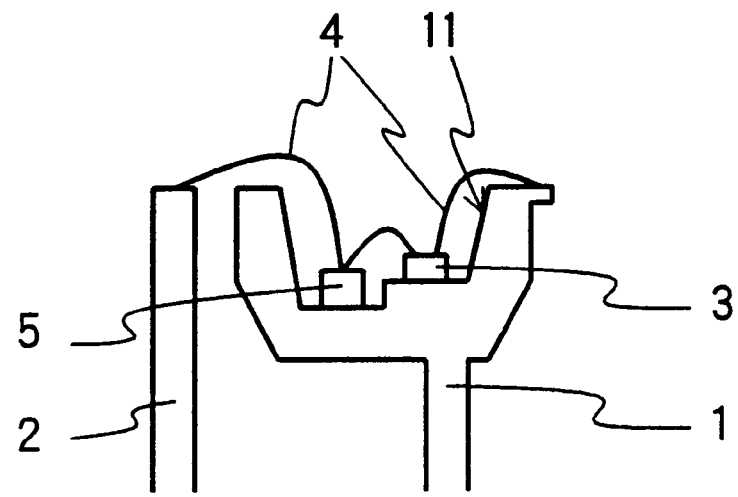
FIG. 14 is a sectional explanatory view showing a further modification to the FIG. 12 embodiment.

Referring to FIG. 14, there is further shown a sectional explanatory view of another embodiment. In this example, a curve-surfaced recess portion 11 of oval in plan is formed only at the tip of the first lead 1, instead of providing in the both first and the second leads 1, 2. In the recess portion 11, an LED chip 3 and a zener diode chip 5 are mounted with their electrode are electrically connected to the first and second leads 1, 2 via gold wires 4 in connecting relations similar to the above embodiment. With also this structure, to chips can be connected by wire-bonding in the common recess portion.

With these structures, the zener diode 5 is mounted, together with the LED chip 3, in the recess portion 17, 11 formed ovally in plan shape at the tips of the first and second leads 1, 2 or only in the first lead 1. Consequently, the zener diode chip 5 can be treated in the same process as the die-bonding and wire-bonding for the LED chip 3. Moreover, were the recess portion 17 is provided in the both leads in a continuous manner, the size of the recess portion can be increased to prevent the both chips and their wires from contacting with, enabling die-bonding and wire-bonding with sufficient working space. Further, the provision of the recess portion in both the leads eliminates the necessity of performing wire-bonding crossing over a wall of a recess portion to another lead, further improving reliability. The light portion laterally emitted from the LED chip 3 is reflected upward by the inner wall of the recess portion, thereby being radiated as if it were emitted by the entire recess portion and hence providing a light emitting device with high brightness. Thus, a semiconductor light emitting device incorporating a protecting element is available without mounting up of cost or lowering in light emitting characteristics.

With these structures, the recess portion ovally shaped in plan is formed at the tips of the both leads or in one lead to mounting with the LED chip and the protecting element. Consequently, a semiconductor light emitting device built with the protecting element is available without incurring increase in the manufacture step number or the device size.

Figure 15:
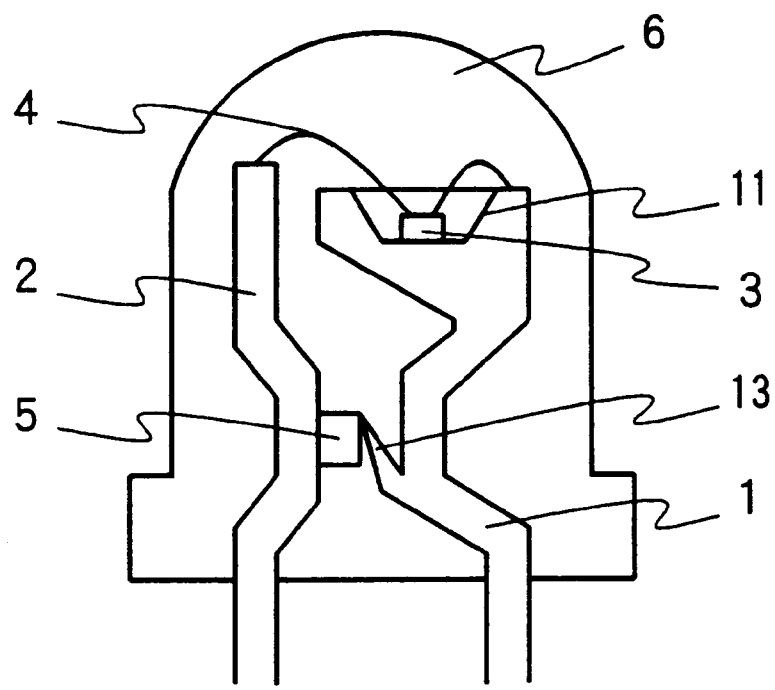
FIG. 15 is a sectional explanatory view of a semiconductor light emitting device according to another embodiment of the present invention.

Referring to FIG. 15, there is shown a sectional explanatory view of a device incorporating therein a protecting element according to another embodiment. In this embodiment, the first lead 1 as a tongue 13 formed on a wall facing the second lead 2 so that a zener diode 5 are directly connected at its electrodes between the tongue 13 and the second lead 2. The zener diode 5 is electrically connected between the first and second leads 1, 2 with the direction thereof reversed to the LED chip 3. Other structures are similar to the above embodiments, and corresponding parts are denoted by the same reference character.

The tongue 13 is formed obliquely projecting in a manner of being thinning at its tip by punch-blanking a sheet member, as shown in FIG. 15. The tongue 13 is formed by using dies having a shape such that the spacing between the tongue 13 and the second lead 2 is smaller, on the tip side of the tongue 13, than the thickness of the zener diode 5 (the spacing between the positive and negative diode provided on opposite faces) and somewhat greater, on the base side of the tongue 13, than the same thickness. That is, in the FIG. 15 embodiment, the second lead 2 is blanked in such a form that the portion thereof facing the tongue 13 nears the tongue 13. The tongue 13 or the second lead 2 can be formed into a desired shape by merely replacing the dies. Accordingly, the tongue 13 has the springiness urging its tip toward the gap inside so that if the zener diode 5 is inserted into the gap from the base of the tongue 13, it is easily inserted and positively fixed. Incidentally, the first and second leads 1, 2 are connected at their lower ends with each other in a leadframe form.

The first lead 1 having this tongue 13 is die-bonded with an LED 3 in its recess portion 11 through an adhesive such as a silver paste, and wire-bonded in a manner as stated before. The zener diode chip 5 is inserted from the base side of the tongue 13 in a state that an electrically conductive adhesive such as a silver paste is applied to the zener diode chip 5 or the tongue 13 and the opposite portion of the first lead 1 to the second lead 2 so that the positive electrode of the zener diode chip 5 is contacted with the tongue 13 of the first lead 1 and the negative electrode thereof contacted with the second lead 2. As a result, the zener diode chip 5 is inserted while being depressed by the tip of the tongue 13 toward the first lead 1, and the zener diode chip 5 is clamped by the springiness. By curing the conductive adhesive, the zener diode chip 5 is firmly fixed in electrical connection with the first and second leads 1, 2.

With this structure, the zener diode chip 5 is directly bonded between the first and second lead 1, 2. Consequently, there requires no space for mounting the zener diode chip 5 around the LED chip 3. Thus, the zener diode chip 5 can be incorporated without making any modification to the light emitting side. Since the zener diode chip 5 is electrically connected by sandwiching between the two leads, there is no necessity of carrying out wire-bonding so that the number of manufacturing processes is almost not increased and there is no fear of causing problems on the reliability of wire-bonding. To this end, a semiconductor light emitting device built with the protecting element is available without incurring increase of cost and reduction in light emitting characteristics.

Incidentally, although in the embodiment of FIG. 15 the tongue 13 was provided in the first lead 1 and the second lead 2 was in a shape that it nears at the portion facing the tongue, the tongue may be provided in the second lead 2 with the first and second leads replaced with each other. Also, the second lead 2 may be formed to have the lead-to-lead spacing coincident with the width of the protecting element without forming it in the nearing shape. Furthermore, another formed projecting portion such as arcuate form in section may be provided in place of the tongue, or it is possible to give the lead-to-lead spacing coincide with the width of the protecting element without providing the projecting portion.

Figure 16:
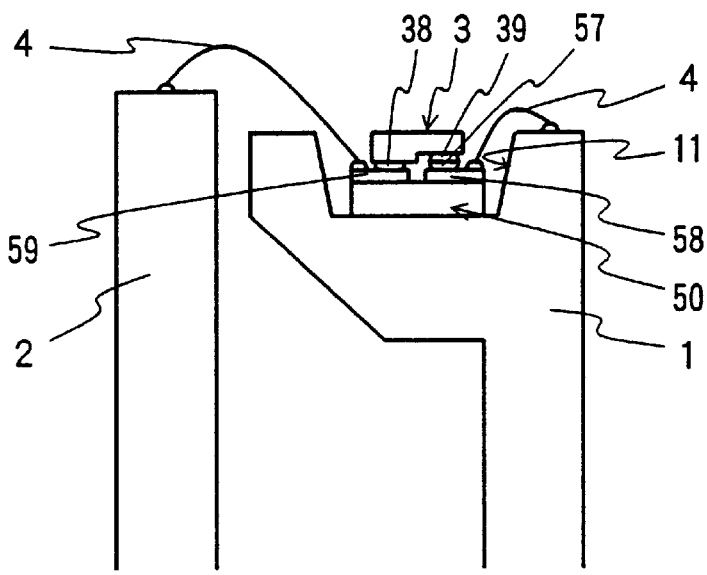
FIG. 16 is a sectional explanatory view of a semiconductor light emitting device according to another embodiment of the present invention.

Referring to FIG. 16, there is further shown a sectional explanatory view of an embodiment built with a protecting element 5. In this embodiment, the first lead 1 has a recess portion 11 in which a zener diode chip 50 is die-bonded. On the surface of the zener diode chip 5, an LED chip 3 is die-bonded through bumps 57 (wherein a bump on the p-side electrode 38 is not shown) with its polarity reversed to that of the zener diode. The zener diode 5 includes two electrodes respectively electrically connected to the first lead 1 and the second lead 2 via gold wires 4. These elements are encapsulated at their around by a dome-shaped package, not shown, thereby providing a lamp-type light emitting device.

Figure 17:
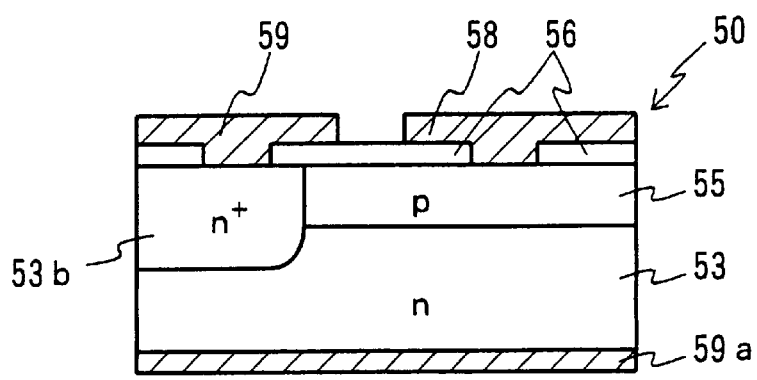
FIG. 17 is a sectional explanatory view showing an example of a protecting element for use in the FIG. 16 embodiment.

The LED chip 3 is formed by a chip for emitting, for example, bluish light (ultraviolet ray to yellow). On the other hand, the zener diode chip 50 includes an n-type silicon semiconductor substrate 53, as exemplified in a sectional explanatory view of FIG. 17. On the substrate 53, a p-type layer 55 is formed by epitaxially growing a p-type semiconductor layer. An n-type impurity such as phosphorus is diffused into part of the p-type layer 55, to provide a n+-type diffusion layer 53b. The substrate thus processed is formed at its surface with a positive electrode 58 and a negative electrode 59 respectively in ohmic contact with the p-type layer 55 and the diffusion layer 53b through an insulating layer 56. Thus, the positive electrode (i.e. electrode connected with the p-type layer) 58 and the negative electrode (electrode connected with the n-type layer) 59 on the surface. This zener diode chip 50 utilizes zener characteristics wherein, if a great reverse voltage is applied to a p-n junction formed between the n-type semiconductor substrate 53 and the p-type layer 55, electrons passes through the p-n junction due to tunnel effects. The voltage at which this reverse current begins to flow (zener voltage) is determined by impurity concentration. Consequently, the zener voltage is set at voltage higher than the operating voltage of the LED chip 3, and the LED chip 3 and connections are made between the p-side electrode 38 of the LED chip 3 and the negative electrode 59 as well as between the n-side electrode 39 of the LED chip 3 and the positive electrode so that the LED chip 3 and the zener diode chip 50 are in parallel and reverse in polarity. This allows the LED chip 3 to operate free from troubles. Incidentally, if an electrode 59a (negative electrode) is provided at the backside of the substrate 51, it is possible to connect the same chip to a lead directly through a conductive adhesive.

Referring to FIG. 16, the above-stated zener diode chip 50 is die-bonded through an adhesive such as a silver paste in a recess portion 11 of the first lead 1. On the zener diode chip 50, the LED chip 3 is connected upside down through a bump 57 of solder or the like such that the n-side electrode 39 and the p-side electrode 38 of the LED chip 3 shown in FIG. 3 are respectively connected with the positive electrode 58 and the negative electrode 59 of the zener diode chip 50. Thereafter, electrical connections are made via gold wires 4 between the positive electrode 58 of the zener diode chip 50 and the first lead 1 as well as between the negative electrode 59 of the zener diode chip 50 and the second lead 2. Incidentally, where the substrate 53 has also a negative electrode at its backside, the chip is directly electrically connected with the first electrode 1 through the conductive adhesive without requiring wire-bonding on the negative electrode 59 side, merely requiring wirebonding on the positive electrode 58 to the second lead 2. These elements including the LED chip 3 and the zener diode chip 50 are encapsulated by a package, similarly to the above-stated embodiment.

Figure 18:
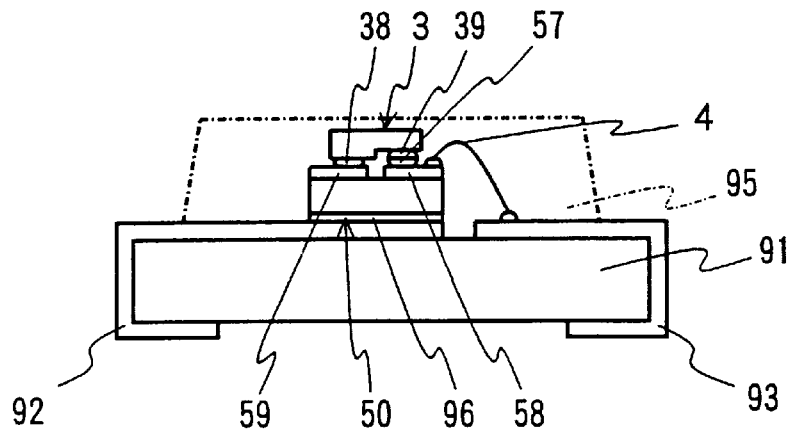
FIG. 18 is a sectional explanatory view of a semiconductor light emitting device according to another embodiment of the present invention.

Referring to FIG. 18, there is shown a view showing a chip-type semiconductor light emitting device to which the structure having an LED chip 3 overlying a zener diode chip 50 is applied. In this embodiment, n-side and p-side electrodes 39, 38 of an LED chip 3 are respectively connected with and die-bonded to, via bumps 57, positive and negative electrodes 58, 59 on one surface (main surface) of a zener diode chip 50. The zener diode chip 50 is mounted by die-bonding at its the other side (backside) on a first terminal electrode 92 as one of the electrodes provided at the opposite ends of a insulating substrate 91 through a bonding agent 96. In this case, by bonding the zener diode chip 50 at its backside negative electrode 56a on the first terminal electrode through the bonding agent 96, the negative electrode 59a is electrically connected with the first terminal electrode 92. The positive electrode 58 is electrically connected via a gold wire 4 to a second terminal electrode 93. These elements are encapsulated by a resin package 95 of an epoxy resin or the like transmittable of the emitted light. With this structure, the height of the device slightly increases, but the protecting element can be incorporated without increasing the device area. Incidentally, the resin package 95 is similarly applicable to the structure having reflecting wall therearound.

With these structures, the light emitting device is provided with the functions similar to the above embodiment. Further, since the protecting element (zener diode chip) is die-bonded underlying the LED chip, there is a necessity of making the light emitting device by an amount corresponding to the area required for performing wire-bonding on the electrode of the protecting element. However, there requires no space for separately providing the protecting element on the device. Meanwhile, it is satisfactory that wire-bonding is made only for the protecting device. There is no necessity of providing electrode pads onto which wire-bonding is done. Consequently, the device has its light radiating main surface where no light shielding elements are present, thus improving light radiating efficiency, i.e. brightness. In this manner, the protecting element is easily incorporated in the light emitting device without increasing the size of the device. As a result, the light emitting device is easy to deal with during the manufacturing process or the mounting process. Further, it is possible to suppress the occurrence inferiorities due to electrostatic breakdown. Moreover, the connection between the LED chip and the protecting element is directly made through the bump reduces the necessity of performing low-reliable wire-bonding to these element. That is, there requires only one line of wire-bonding at the minimum, greatly improving reliability. Thus, a semiconductor light emitting device is available which is greatly improved in reliability with high brightness due to unnecessity of wire-bonding to the light emitting chip, and resistive to the application of reverse voltages or high electrostatic voltages.

Where the LED chip is formed of a gallium-nitride based compound semiconductor that is liable to be damaged by high voltages such as reverse voltages or surge voltages, the present embodiment is preferred because the sapphire used as a substrate is highly transmissible of the emitted light and the n-side electrode and the p-side electrode are provided on one surface. Also, even if a high voltage such as a surge voltage is forwardly applied to the light emitting chip, the zener characteristics of the zener diode used as a protecting element serves to protect the light emitting chip from being damaged by such high voltage. The use of the zener diode chip is preferred because it will not cause any abnormality in usual services.

Referring to FIG. 19(a) to FIG. 22, there is demonstrated detailed structural views of chip-type light emitting devices built with a protecting element. The chip-type light emitting devices are small in size, i.e. usually ranging from a 1.6 mm length by a 2.5 mm width to a 0.8 mm length by 1.6 mm width. The diode or the like is difficult to provide outside the device. The placing of the diode laterally adjacent an LED chip requires increase in the width of the base plate. If the diode is placed on one terminal electrode in lengthwise direction, the LED chip is difficult to place at a central portion of the base plate or the wire-bonding on the diode must be made striding over the LED chip resulting in obstruction for light emission or possible wire contact.

The embodiment of FIGS. 19(a) and 19(b) has been made as one example in order to solve these problems, which is small and very thin but highly resistive to surge voltages such as reverse voltage or electrostatic voltages, providing a chip-type light emitting device easy to deal with.

Figure 19:
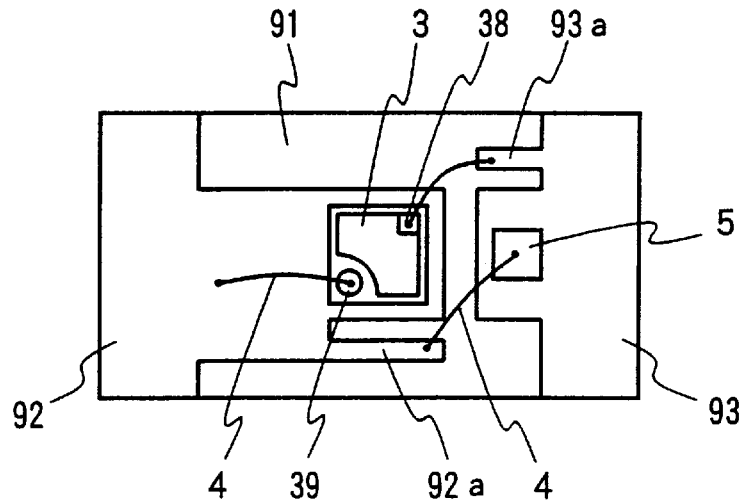
FIGS. 19(a) to 19(b) are sectional and plan explanatory views of a semiconductor light emitting device according to further embodiment of the present invention.
Figure 19:
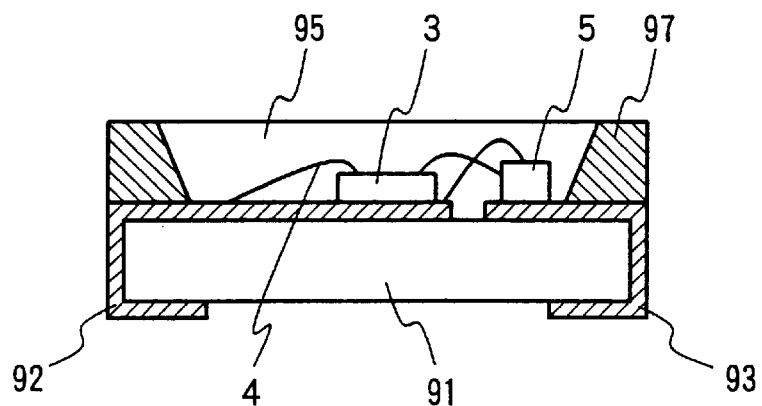

This embodiment includes first and second terminal electrodes 92, 93 provided at opposite portions in a surface of an insulating base plate 91 wherein the first terminal electrode 92 extends at one end almost to a central portion of the insulating base plate 91, as shown by plan and sectional explanatory views of FIGS. 19(a) and 19(b). An LED chip 3 is die-bonded on the tip side of the first terminal electrode 92. The LED chip 3 has an n-side electrode 39 and a p-side electrode 38 respectively connected via gold wires 4 to the first terminal electrode 92 and a pad 93a integrally formed with the second terminal electrode 93. Further, a zener diode chip 5 is die-bonded on a tip portion of the second terminal electrode 93 so that it is electrically connected reverse in polarity to the LED chip 3 between the first and second terminal electrodes 92, 93. These elements are encapsulated by a resin package 95. In the FIG. 19 embodiment, a reflecting case 97 is further provided around the resin package 95.

The insulating substrate 91 is formed by an insulating member of a glass cloth impregnated with a thermal resistive BT resin. In the manufacture, the terminal electrodes 92, 93 are formed by applying a silver paste by screen printing to a large-sized undivided substrate at its main and back surfaces. By curing the silver paste, electrodes extending between the main and back surfaces are provided. The formation of the electrodes is performed on the basis of a plurality of chips, i.e. in batch, on a large undivided substrate. The large substrate has slots in lateral surfaces at boundaries between chips. During formation of electrodes, the silver paste flows into the slots so that the resulting chip device has terminal electrodes extending between the main and back surfaces through the lateral surface of the base plate, as shown in FIG. 19(b). Meanwhile, the LED chip 3 has a structure as shown in FIG. 3 stated before, while the zener diode chip 5 is similar to that of the FIG. 10 embodiment.

The LED chip 3 is die-bonded on the tip portion of the first terminal electrode 92 so that the n-side electrode 39 and the p-side electrode 38 are respectively wire-bonded via gold wires 4 to the first terminal electrode 92 and the pad 93a formed integral with the second terminal electrode 93, providing electrical connection. Further, the zener diode chip 5 is die-bonded on the tip portion of the second terminal electrode 93 so that the positive electrode thereof is electrically connected to the pad 92a formed integral with the first terminal electrode 92. At this time, the negative electrode of the zener diode is electrically connected to the to the second terminal electrode 93 through the conductive adhesive used in die-bonding. Also, if the LED chip has in structure an n-side electrode and a p-side electrode at opposite surfaces, it can be electrically connected through a conductive adhesive without wire-bonding in a manner similar to the zener diode chip 5. A reflecting case s provided so as to surround these elements on the insulating substrate 91, and the elements including the LED chip 3 and the zener diode chip 5 are molded by a transparent or milky white epoxy resin or the like that is transmissible of the light emitted by the LED chip 3. Thus, a chip-type light emitting device encapsulated by the resin package 95 is obtained according to the present invention.

Figure 20:
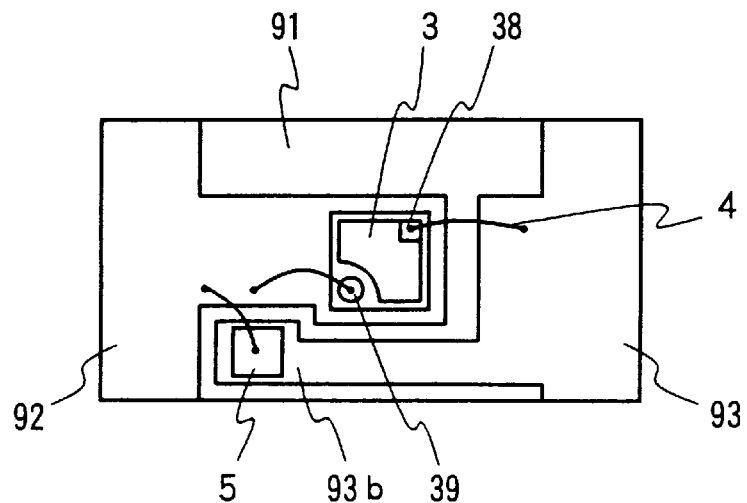
FIG. 20 is a plan explanatory view showing a modification to the FIG. 19 embodiment.

Referring to FIG. 20, there is shown a plan explanatory view of a modification to the FIG. 19 embodiment, wherein a resin package is omittedly shown similarly to FIG. 19(a). This embodiment has a second terminal electrode 93 having an extended portion 93b extended therefrom to a laterally adjacent portion of a first terminal electrode 92 so that a zener diode chip 5 is mounted on the extended portion 93b. With this structure, it is possible to shorten the length of a gold wire 4 connecting between the first terminal electrode 92 and a positive electrode of the zener diode chip 5, preventing contact of wires. In also this structure, since the LED chip 3 is provided on the first terminal electrode 92 as one terminal electrode and the zener diode chip 5 is on the second terminal electrode 93 as the other terminal electrode, the LED chip 3 can be placed at almost the central area on the insulating base plate 91 with the protective element built-in in the device.

In this embodiment, since the LED chip and the zener diode chip are respectively die-bonded on separate terminal electrodes, a small-sized chip-type light emitting device is realized wherein the LED chip is centrally placed with the protecting element built therein. In the chip-type light emitting device thus incorporating the protecting element, the LED chip 3 that is prevented against reverse voltages or high forward voltages, similarly to the above-stated lamp-type light emitting device.

In this structure, the LED chip 3 is die-bonded on the first terminal electrode and the zener diode chip is die-bonded on the extra space on the second terminal electrode, the following problem is well prevented: obstruction to light radiation due to excessively close arrangement of the respective chips (the zener diode higher than the LED chip, if placed immediately adjacent thereto, possibly obstructs the light emitted toward it), short circuit due to a die-bonding adhesive (shorting due to the die-bonding adhesive raised between the two chips), and poor wire bonding (the die-bonding adhesive flown to a terminal electrode makes difficult or impossible wire-bonding thereto). Thus, a chip-type light emitting device is available which is small and ultra-thin and highly resistive to static electricity or reverse voltage applied.

In this manner, a small-sized chip-type light emitting device is obtained which emits light with high brightness by the LED chip centrally placed with the protecting element incorporated. The light emitting device does not suffer damages due to high reverse voltages or static electricity voltage, thus improving reliability.

Although in the above embodiment the protecting device was placed within the transparent resin, if at least part of the protecting element is placed under the reflecting case, the light emitted from the LED chip is more sufficiently reflected upward without being obstructed by the protecting element. Also, if the height of the protecting element is made lower than the height of the LED chip by die-bonding the protecting element in a recess portion formed beneath the protecting element or die-bonding the LED chip through a spacer so as to raise the height of the LED chip, the obstruction of the emitted light by the protecting element can be further reduced.

Further, the above embodiment was of a type having the reflecting case 9 around the resin package 6 encapsulating the LED chip 3, the above functions and effects are similarly available to a chip-type light emitting device having a structure merely encapsulating the light emitting LED chip 3 without the reflecting case.

Referring to FIGS. 21(a) and 21(b), there is shown another structural embodiment of a chip-type light emitting device. This embodiment has first and second terminal electrodes 92, 93 having respective one opposite ends defining a predetermined gap defined therebetween. These terminal electrodes 92, 93 has an LED chip 3 directly die-bonded at its n-side electrode 39 and p-side electrode 38 thereon. Further, a zener diode chip 5 is also die-bonded on the first and second terminal electrodes 92, 93 through a conductive adhesive so that the zener diode chip 5 is in electrical connection reverse in polarity to the LED chip 3. Other structures are similar to those of FIGS. 19 and 20.

Figure 21:
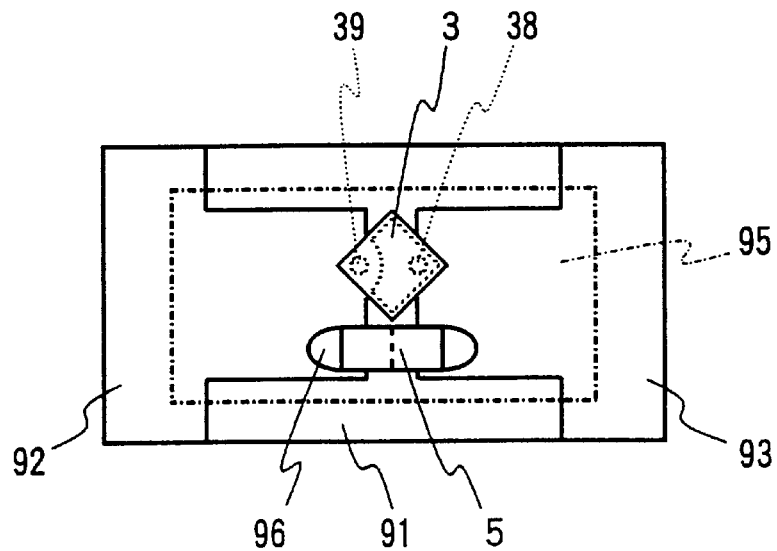
FIGS. 21(a) to 21(b) are sectional and plan explanatory views of a semiconductor light emitting device according to further embodiment of the present invention.
Figure 21:
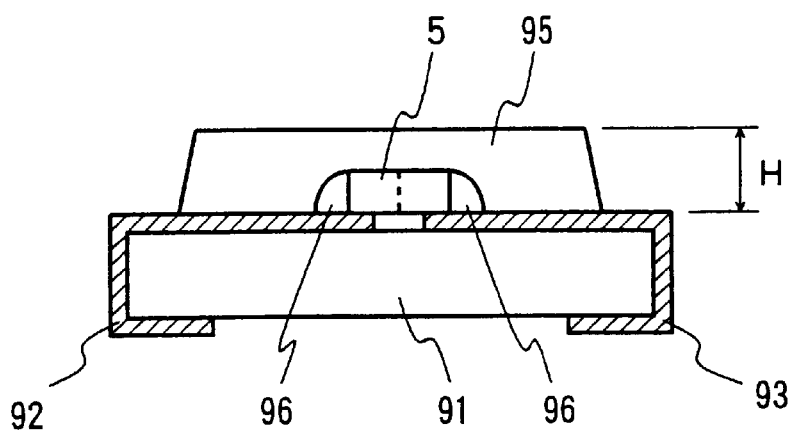

To manufacture the light emitting device, an LED chip 3 is placed upside down at its n-side electrode 39 and p-side electrode 38 respectively placed on first and second terminal electrodes 92, 93, as shown in FIG. 21(*a*). The LED chip 3 is fixed through a previously applied bonding adhesive 96. Incidentally, if there is a fear of short circuit between the n-side electrode and the p-side electrode in the surface of the LED chip 3, it will be prevented by providing an insulating film in the surface excepting the electrodes of the LED chip 3. Meanwhile, a zener diode chip 5 is placed sideways so that its positive electrode and negative electrode respectively contacted with the first and second terminal electrodes 92, 93. The zener diode chip 5 is fixed through a conductive adhesive such as a silver paste. Incidentally, if the LED chip is of a structure having n-side and p-side electrodes respectively arranged at its top and bottom surfaces, it is die-bonded sideways with its electrodes respectively contacted with the first and second terminal electrodes, similarly to the zener diode chip 5. These elements including the zener diode chip 5 is molded by a transparent or milky-white epoxy resin or the like that is transmissible of the light emitted by the LED chip 3. Thus, a chip-type light emitting device encapsulated by a resin package 95 is obtained.

With this structure, the chip-type light emitting device has functions similar to those of the above-stated device. Furthermore, since the LED chip 3 and the zener diode chip 5 each are directly connected with the first and second terminal electrodes 92, 93, no wire-bonding is required therebetween. Therefore, the device can be made with its height with reference to the surface of the base plate 91 is slightly higher than the height of the LED chip 3 or the zener diode chip 5, i.e. a ultra-thin device can be made with the height E from the surface of the base plate is lower than 0.5 mm. In horizontal directions, the LED chip 3 and the zener diode chip 5 are die-bonded side-by-side, there is no necessity of increasing the size at all due to unnecessity of wirebonding. To this end, a small and ultra-thin chip-type light emitting device is available which has the protecting element for preventing against applied voltages of static electricity or reverse currents.

Figure 22:
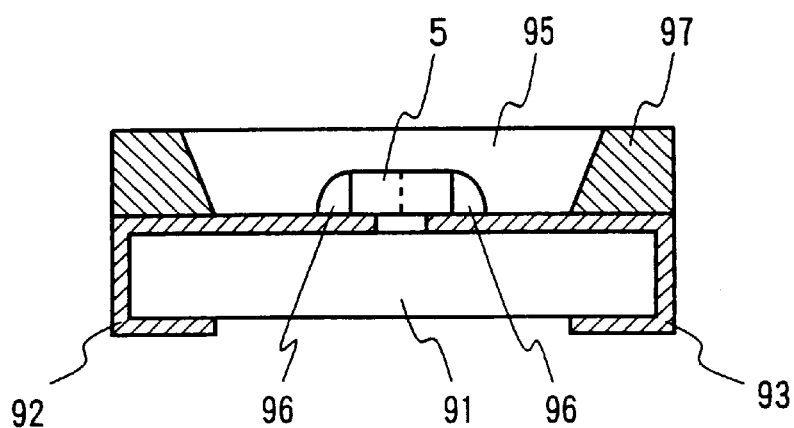
FIG. 22 is a sectional explanatory view showing a modification to the FIG. 21 embodiment.

Although in the above embodiment the chip-type light emitting device was constructed by the resin package 95 encapsulating the LED chip 3 using a resin transmissible of the light emitted by the LED chip 3, it is possible to make a ultra-thin light emitting device incorporating a protecting element therein by using a reflecting case 97 surrounding the elements on the base plate 91 so that the light emitted by the LED chip 3 is reflected upwardly, as shown in FIG. 22. Incidentally, in FIG. 22 the corresponding parts to those of FIG. 21 are denoted by the same reference character to thereby omit explanation thereof.

With these structures, since the LED chip ad the protecting element are directly connected with the terminal electrodes, the light emitting device is almost free from damages due to voltages applied by reverse currents or static electricity, thus improving reliability and making the thickness to a ultra-thin size. It is therefore possible, if such a device is applied, to reduce the thickness of a light source used in a switch button or the like for portable appliances such as handy telephones or PHSs, thus contributing to reduce the size and the weight of such portable appliances.

Referring to FIGS. 23 through 29, explanations will be made for embodiments wherein an LED chip and a protecting element is formed within one chip.

As shown in a sectional explanatory view of one one-chip type embodiment in FIG. 23, on a common substrate (that is actually thicker than semiconductor layers though depicted thin) 31 are formed a light emitting portion 3 and a diode portion (hereinafter referred to as "protecting diode portion") as a protecting element. The light emitting portion 3 has a p-type layer 35 at its p-side electrode 38 electrically connected to a negative electrode 59 for a n-type region 53 of the protecting diode portion 5, while a n-type layer 33 of the light emitting portion 3 at its n-side electrode 39 is electrically connected to a positive electrode 58 for a p-type region 55 of the protecting diode portion 5 so that terminals 1, 2 thus connected are applied electrical voltages therebetween. In the FIG. 23 embodiment, the light emitting portion 3 and the protecting diode portion 5 are formed in one chip. Incidentally, the electrical connections for the semiconductor layers may be interconnected within a semiconductor chip, or may be connected through wire-bonding after die-bonding chips on leads or the like.

Figure 23:
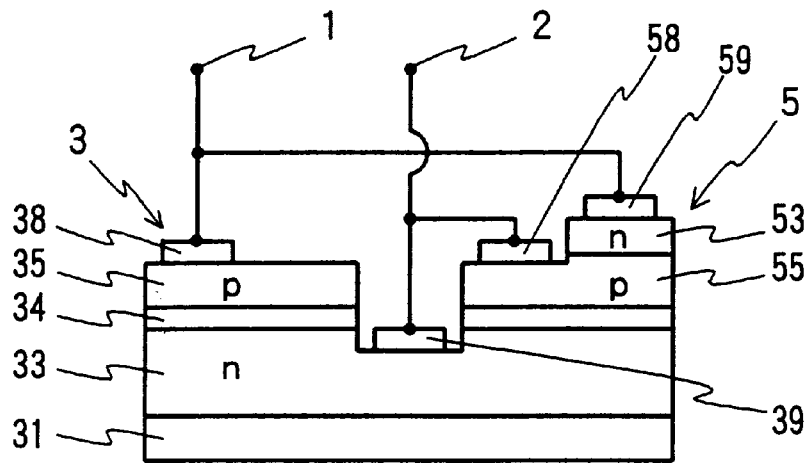
FIG. 23 is a sectional explanatory view of a semiconductor light emitting device according to another embodiment of the present invention.

Although in FIG. 23 a buffer layer is not shown in the light emitting portion 3, it is formed in a structure as shown in FIG. 3. Accordingly, it is denoted by the same reference character to omit explanation thereof.

The protecting diode portion 5 has a diode p-type region 55 formed by a p-type layer of a semiconductor layer for forming the light emitting portion 3, and a diode n-type region 53 formed by partly etching a n-type semiconductor layer epitaxially grown thereon. These p-type and n-type regions 55, 53 are respectively formed with positive electrode 58 and negative electrodes 59. If this protecting diode portion 5 is formed of a same material as that of the light emitting portion 3, e.g. a gallium-nitride base compound semiconductor, as shown in FIG. 23, it has a generally high forward voltage (the voltage at which a current begins to flow, and determined by a composition of the semiconductor). It is preferred that this forward voltage is low from the viewpoint of the above protecting element. The forward voltage characteristics of the protecting diode portion 5 is determined by a reverse voltage-withstanding characteristics of the light emitting portion to be protected. The forward voltage characteristics of the protecting diode portion 5 is provided to have a lower voltage than the reverse voltage for the light emitting portion to be protected.

In order to lower the forward voltage characteristic for the gallium-nitride based compound semiconductor used, an impurity such as Si or Se is doped to a high concentration. By doing so, the forward voltage for the gallium-nitride based compound semiconductor can be reduced to as low as approximately 2.5 V, thereby preventing the semiconductor layers from being deteriorated or damaged. To further reduce the forward voltage of the protecting diode portion 5, the protecting diode may be formed by depositing silicon semiconductor layers. However, the forward voltage for the protecting diode portion can be made lower than the driving voltage to the light emitting portion by using the same semiconductor material as the light emitting portion, preventing against deterioration due to A.C. reverse voltage applied. Meanwhile, a zener diode can be formed by depositing the semiconductor material or silicon semiconductor as stated above.

The light emitting portion 3 and the protecting diode portion 5 function in a similar manner to the afore-said structure having the LED chip and the protecting diode chip so that the LED has no reverse voltage higher than the forward voltage for the protecting diode 5. Therefore, the LED in the light emitting portion is free from useless reverse voltages applied, and accordingly there is no fear of deteriorating or damaging the semiconductor layers.

Figure 24:
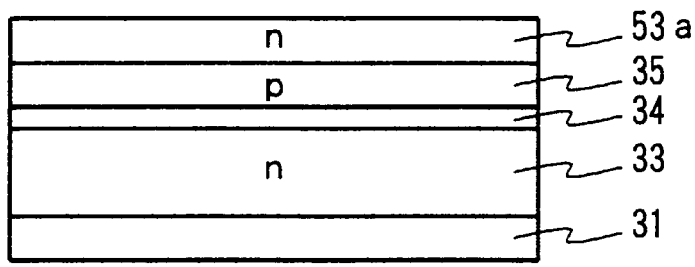
FIGS. 24(a) to 24(c) are sectional explanatory views showing manufacturing processes for the FIG. 23 embodiment.
Figure 24:
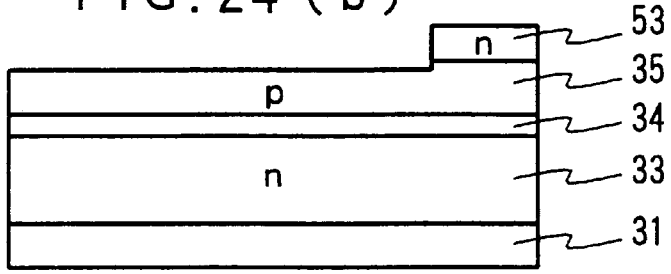
Figure 24:
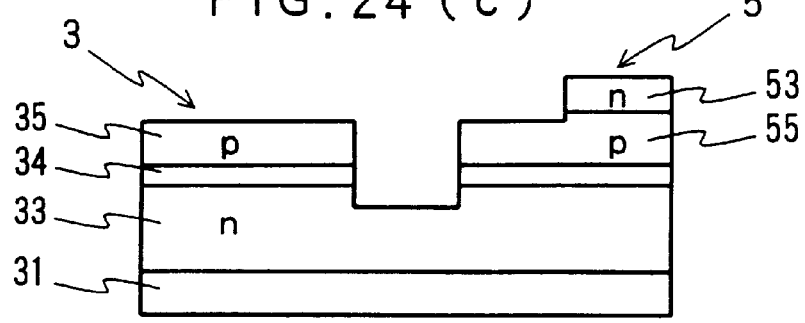

Now explanations will be made on a method for manufacturing a semiconductor light emitting device as shown in FIG. 23, with reference to manufacture processing views of FIG. 24(*a*) through FIG. 24(*c*).

Referring to FIG. 24(a), on a sapphire substrate 1 is introducing reacting gasses and a dopant gas together with a carrier gas to form, through a GaN low-temperature buffer layer, an n-type layer 33 having an n-type GaN sublayer and an AlGaN-based compound semiconductor sublayer to a layer thickness of approximately 1–5 $\mu$m, an active layer 34 of an InGaN-based compound semiconductor to a layer thickness of approximately 0.05–0.3 $\mu$m, a p-type layer 35 of having an AlGaN-based compound semiconductor sublayer and a GaN sublayer to a layer thickness of approximately 0.2–1 $\mu$m, and an n-type semiconductor layer 53a of GaN to a layer thickness of approximately 0.2–1 $\mu$m. Incidentally, were depositing silicon layers, a silane gas (SiH$_4$) may be used as a reacting gas.

Then, in order to form an n-type region 53 for a protecting diode as shown in FIG. 24(b), the n-type semiconductor layer 53a is etch-removed from areas for forming a light emitting portion and part of a protecting diode portion by reactive ion etching using principally a chlorine gas.

Thereafter, the semiconductor layers at the light emitting portion is partly etched by a reactive ion etching in the similar manner to the above to thereby expose part of the n-type layer 33, as shown in FIG. 24(c). Then, Ni and Au are respectively evaporated onto the p-type layer 35 of the light emitting portion, and then heat treated into a current diffusion layer having a layer thickness of approximately 2–100 nm. Thus, a p-side electrode 38 of a Ti/Au overlying structure and an n-side electrode 39 of a Ti/Al alloy as well as a positive electrode 58 and a negative electrode 59 are provided, as shown in FIG. 23.

In the embodiment of FIG. 23, the protecting diode portion 5 is of an layered structure having the p-type region 55 and the n-type region 53. Where a diode is formed by such a layered structure, a semiconductor layer, for example, of an InGaN-based compound semiconductor having a low bandgap energy similarly to an active layer is exitaxially grown prior to epitaxially growing an n-type region 53, a diode can be formed by a doublehetero structure similarly to the light emitting portion 3. With this doublehetero structure, a protecting diode portion 5 is provided which has favorable characteristics with low forward voltage. Particularly, where the light emitting portion 3 is formed of a gallium-nitride based compound semiconductor, the diode has a high forward voltage. However, such forward voltage is lowered by forming the diode in a doublehetero structure. As a result, the application of reverse voltages to the light emitting portion can be reduced to a low level.

Figure 25:
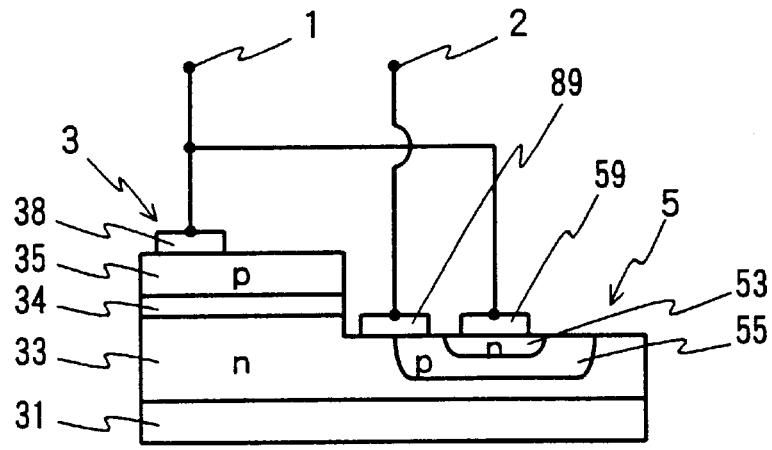
FIG. 25 is a sectional explanatory view showing a modification to the FIG. 23 embodiment.

Referring to FIG. 25, there is shown a sectional explanatory view of a one-chip semiconductor light emitting device according to another embodiment. This embodiment is characterized by having a p-type region 55 and an n-type region 53 formed by impurity diffusion or the like into an n-type layer 33, and a common electrode 89 serving as an n-side electrode for a light emitting portion 3 and a positive electrode for a protecting diode portion 5. That is, on a sapphire substrate 31 are formed an n-type layer 33, an active layer 34, and a p-type layer 35 so that these semiconductor overlying layers are partly etch-removed to expose the n-type layer 33. The exposed n-type layer 33 has, at its surface, a p-type region 55 formed by introducing by ion implanting a p-type impurity. The p-type region 55 further has an n-type region 53 formed by introducing by ion implanting an n-type impurity. Thus, a p-n junction diode is formed to thereby providing a protecting diode portion 5. A common electrode 89 is provided striding over both the n-type layer 33 and the p-type region 55 in order to making common an n-side electrode for the light emitting portion 3 and a positive electrode for the protecting diode portion 5. Other structures for the light emitting portion 3 are similar to the FIG. 23 example, and they are denoted by the similar reference character, thereby omitting explanations thereof.

Figure 26:
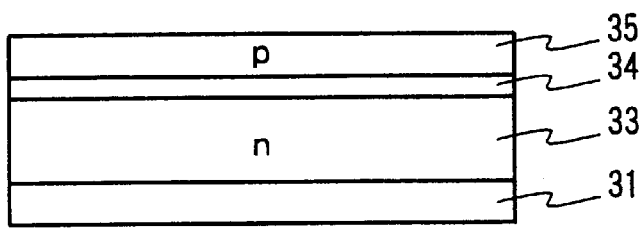
FIGS. 26(a) to 26(c) are sectional explanatory views showing manufacturing processes for the FIG. 25 embodiment.
Figure 26:
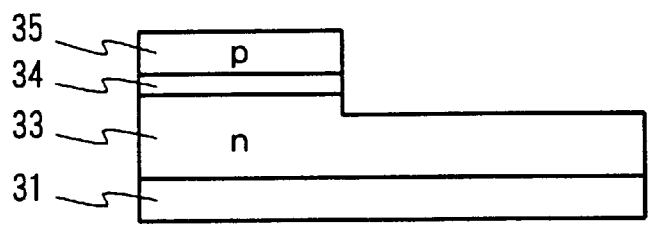
Figure 26:
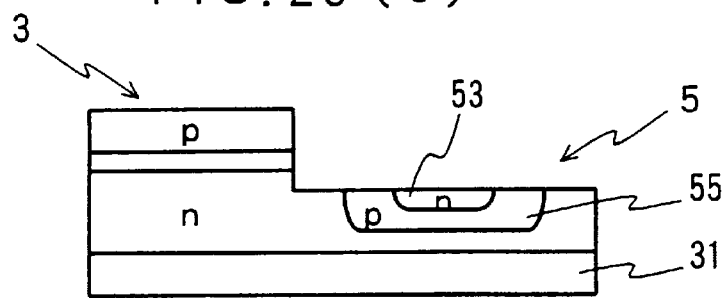

Now explanations will be made on a method of manufacturing a semiconductor light emitting device as shown in FIG. 25 with reference to manufacturing process views of FIG. 26. First, on a substrate 31, an n-type layer 33, an active layer 34, and a p-type layer 35 are formed in the same manner as the semiconductor layers of the FIG. 24(a) embodiment, i.e. with the same material and thickness, to obtain an overlying structure as shown in FIG. 26(a).

Then, as shown in FIG. 26(b), the semiconductor layers 33 to 35 are partly removed at an n-side electrode forming area for a light emitting portion and a protecting diode forming area by a reactive ion etching, thereby partly exposing the n-type layer 33.

Thereafter, as shown in FIG. 26(c), a p-type impurity such as Mg or Zn is introduced into the surface of the n-type layer 33 by diffusion or ion implantation through masking, forming a p-type region 55. Further, an n-type impurity such as Si or Se is introduced through masking in a similar manner to the above into the p-type region 55, forming an n-type region 53. Then electrodes are formed in a similar manner to the above, thereby providing a semiconductor light emitting device chip as shown in FIG. 25. In the formation of the electrodes, a common electrode 89 is provided by patterning an electrode material to cover over both the n-type layer 33 and the p-type region 55.

In the embodiment shown in FIG. 25, an n-side electrode for the light emitting portion and a positive electrode for the protecting diode portion 5 are made common, which enables reduction in the number of the electrodes to be formed. Accordingly, the n-side electrode forming area for the light emitting portion 3 can be narrowed to increase the ratio in area of the light emitting portion is enhanced with respect to the same chip area with the result that the brightness is improved or the chip size is reduced in size.

Figure 27:
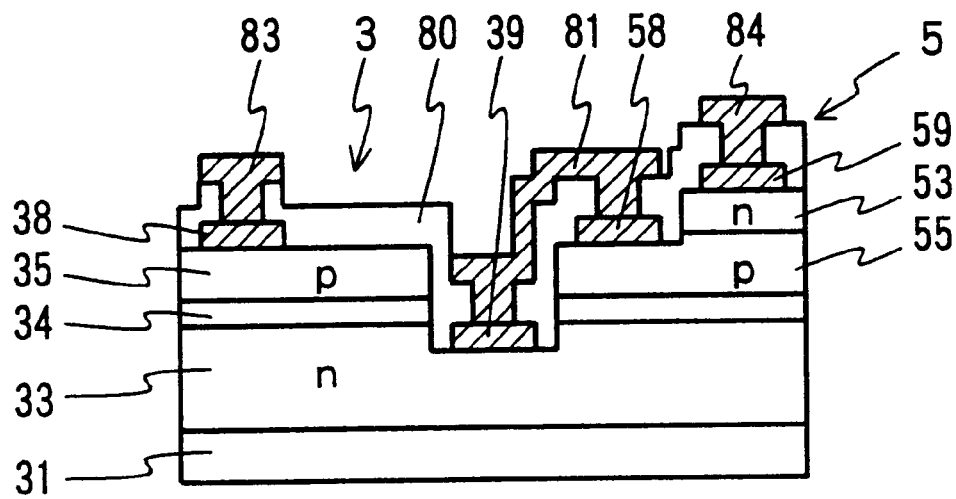
FIG. 27 is a sectional explanatory view showing an interconnect pattern for the FIG. 23 embodiment.
Figure 28:
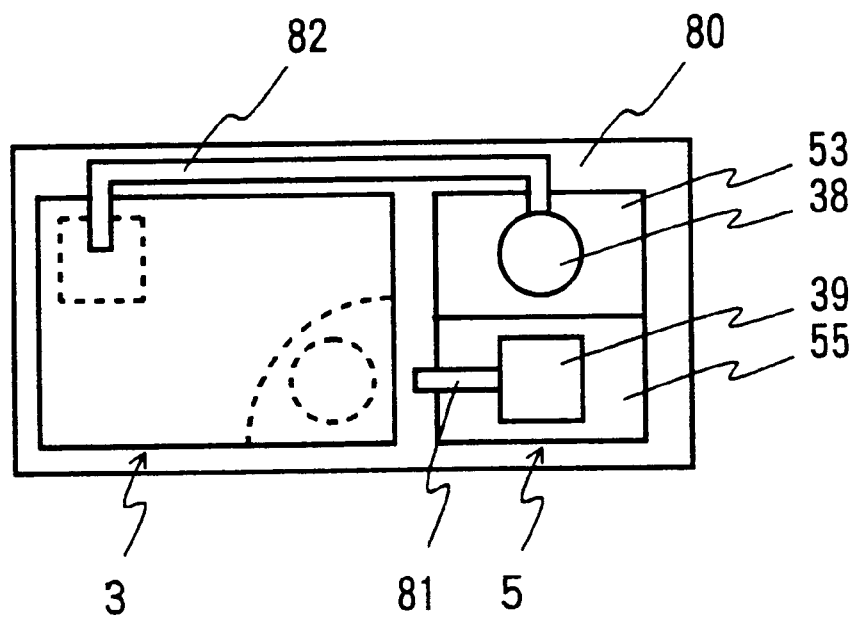
FIG. 28 is a plan explanatory view showing an interconnect pattern for the FIG. 23 embodiment.

Referring to FIG. 27 and FIG. 28, there is demonstrated an example of electrical connections of the n-type layer 33 and the p-type layer 35 of the light emitting portion 3 respectively with the p-type region 55 and the n-type region 53 of the protecting diode portion 5. To provide such electrical connections as in FIG. 27, after forming the light emitting portion 3 and the protecting diode portion 5 through formation of the semiconductor layers and the respective electrodes, the substrate thus treated is coated at its surface with an insulating layer 80 of SiO or SiN. Then, contact holes are formed at electrode forming regions through the insulating layer 80 to evaporate and pattern Al or the like, providing an interconnect 81 that electrically connects between the n-side electrode 39 and the positive electrode 58. Incidentally, the connection between the p-side electrode 38 and the negative electrode 59, though only pads 83, 84 respectively connected therewith are shown, may be made through wire-bonding or an interconnect laid along an chip peripheral portion as shown in FIG. 28 nextly explained. Incidentally, the parts corresponding to those of FIG. 23 are denoted by the same reference character to omit explanations thereof.

In FIG. 28 is shown a plan explanatory view, wherein electrical connections are made, through contact holes, of the n-type layer 33 and the p-type layer 35 of the light emitting portion 3 respectively with the p-type region 55 and the n-type region 53 of the protecting diode portion 5. These connections are given by Al interconnects or the like through an insulating layer 80, similarly to those of FIG. 27. These interconnects through the contact holes provides electrical connections in small areas without forming pads for all the electrodes. The electrode for wire-bonding connection to the external may be provided at any portion of the interconnects. It is therefore possible to form the p-side and n-side electrodes 38, 39 for the light emitting portion 3 atop the protecting diode portion 5 without providing electrodes on the light emitting portion side. With this structure, the light emitting portion 3 has no light-blocking electrodes at its light radiating face except for a narrow interconnect portion, thereby improving light radiation efficiency, i.e. the efficiency of radiating light outward of the device. Incidentally, although in FIG. 28 broken lines shows areas for conventional p-side and n-side electrodes, these areas can be utilized for a light emitting region by the present embodiment. In also FIG. 28, the parts corresponding to those of FIG. 23 or FIG. 27 are denoted by the same reference character to omit explanations thereof.

Figure 29:
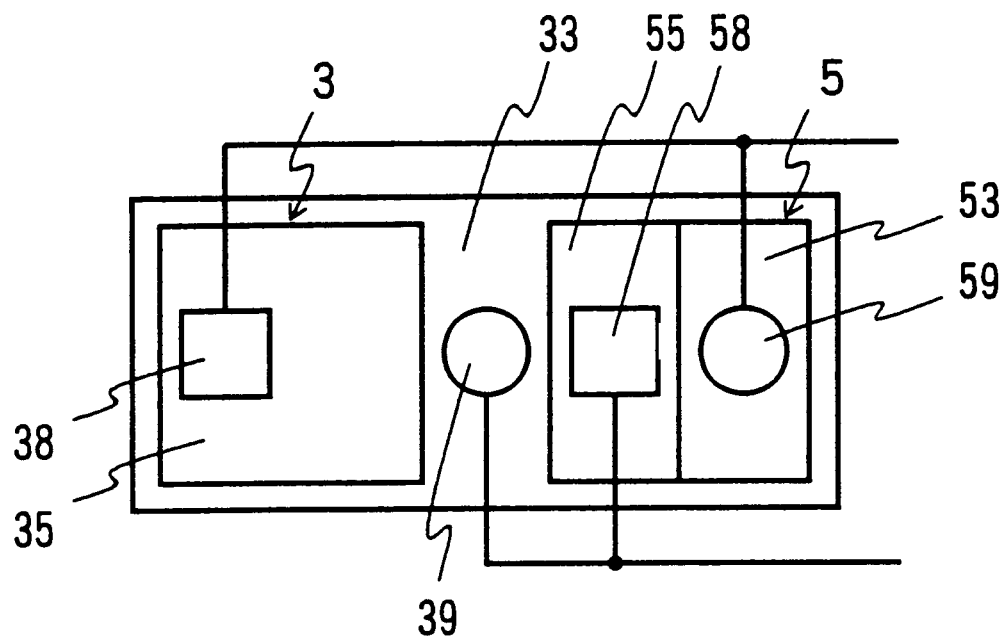
FIGS. 29(a) to 29(b) are plan explanatory views of an interconnect pattern showing modifications to the FIG. 23 embodiment.
Figure 29:
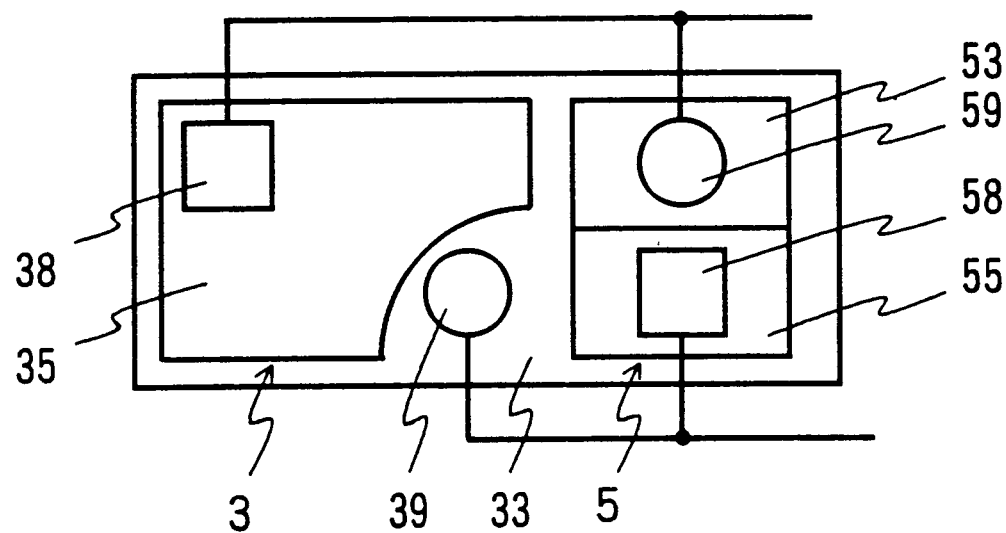
Figure 30:
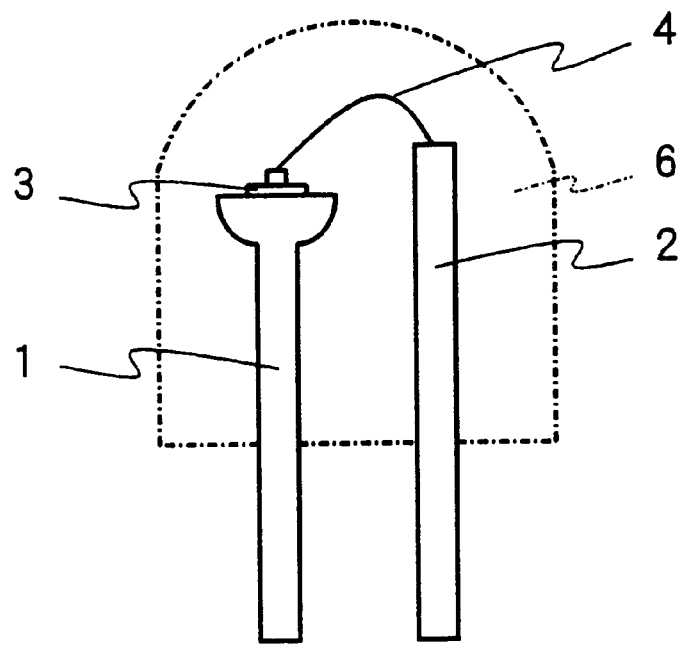
FIG. 30 is a side explanatory view of one example of a conventional lamp-type semiconductor light emitting device.
Figure 31:
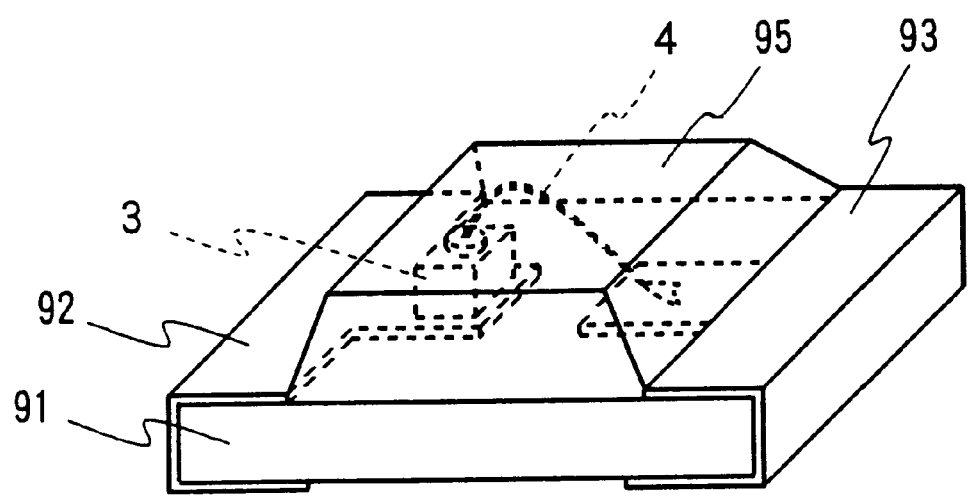
FIG. 31 is a perspective view of one example of a conventional chip-type light emitting device.

Referring to FIGS. 29(a) and 29(b), there is exemplified an electrode pattern having respective electrodes 38, 39, 59, 58 provided on the p-type layer 35, the n-type layer 33, the n-type region 53 and the p-type region 55, wherein these electrodes are in electrical connection through bonded wires extending outside the device. In the example of FIG. 29(a), the n-type and p-type regions 53, 55 of the protecting diode portion 5 are arranged in line with the light emitting portion 3 so that the electrodes 38, 39, 58 and 59 are provided in on-one-line manner. Meanwhile, in FIG. 29(b) the n-type region 53 and the p-type region 55 are provided perpendicular with respect to the light emitting portion 3 so that the n-side electrode 39 is arranged at a location of a corner of the light emitting portion. In also FIG. 29, the parts corresponding to those of other Figures are denoted by the same reference character to omit explanations thereof.

It is needless to say that the electrical connections for electrodes or the like are not limited to the structures of the above embodiment and other structures or methods may be applicable.

By thus making the light emitting portion and the protecting diode portion in one chip, a lamp-type or chip-type semiconductor light emitting device having a protective function against reverse voltage is obtained only through die-bonding the chip on a lead to perform wire-bonding therebetween or on an insulating base plate having opposite terminal electrodes to provide electrical connections. Moreover, since there is no necessity of providing wire-bonding electrodes (pads) over the light emitting portion, the semiconductor light emitting device, if made small, will have a light emitting portion that can radiate bright light almost free from light shielding.

Although in the above embodiments the LED chip or the light emitting portion employed a gallium-nitride based compound semiconductor suited for bluish light emission, the greater effects are available for such a material that is liable to be damaged by reverse voltages or high voltages. However, the present invention is not limited to such a material, but other materials, such as a GaAs-based semiconductor, an AlGaAs-based semiconductor, an AlGaInP-based semiconductor and an InP-based semiconductor, suited for red or green light emission is also applicable to a device of the present invention. With such a material, the provision of the protecting element also makes the semiconductor light emitting device highly resistive to reverse voltages and static electricity voltages. Furthermore, the present invention is not limited to a doublehetero structure having an active layer sandwiched between an n-type layer and a p-type layer, but is also applicable to a p-n junction structure having a direct junction of an n-type layer and a p-type layer.

The above embodiments was provided, as a protecting element, with a zener diode or an ordinary protective diode. Where a zener diode is provided, even if a large amount of static electricity due to a surge current or the like is forwardly applied to the light emitting portion, the static electricity is discharged through the zener diode to release the LED chip from suffering an excessively high voltage. There is no fear of damaging the LED chip by the forward high voltages due to externally applied surges, thus providing sufficient protection and hence great effects. However, it is possible to protect similarly the LED chip by employing, in place of the diode, a diode-connected transistor, a MOSFET having its gate connected to a source or a drain, a composite electronic element combined with these element to protect in respective directions similarly to the above zener diode, or an IC. Incidentally, the protective voltage such as the zener voltage has to be set at such a higher voltage that has no bad effect upon the operation of the LED chip but is lower than a voltage that may cause damage.

In addition, the built-in protective element may be of a molded product form in place of the chip form.

According to the resent invention, the light emitting portion is connected in parallel with the protecting element in a manner reverse in polarity so that, if a reverse voltage is applied to the light emitting portion, there is almost no possibility of damaging the light emitting portion or deteriorating its characteristics. Consequently, were a gallium-nitride based compound semiconductor is used for the semiconductor light emitting device, the resulting device does not suffer any trouble, thus being convenient to use with improved reliability.

Further, if an element such as a zener diode offering bidirectional protections is incorporated in the device, the light emitting portion can be protected from suffering a large forward surge such as static electricity applied. To this end, the device is free from damages due to the application of reverse voltages or high static electricity voltages, thus improving reliability.

In addition, the incorporation of the protecting element, even in a half-finished or finished good state, eliminates the necessity of using a grounding band or especial attentions to remove static electricity, improving operational efficiency.

If the protecting element or its base portion is encapsulated by a thermal resistive encapsulating material, thermal resistance is improved for the protecting element, further improving reliability.

Although preferred embodiments have been described in some detail, it is to be understood that certain changes can be made by those skilled in the art without departing from the spirit and scope of the invention as defined by the appended claims.

What is claimed is:

1. A semiconductor light emitting device incorporating therein with:
   a light emitting portion formed by semiconductor overlying layers including a first conductivity layer and a second conductivity layer in order to form a light emitting layer;
   a protecting element portion provided in electrical connection between said first conductivity type layer and said second conductivity type layer so that said light emitting portion is protected against at least a reverse voltage applied to said light emitting portion; and first and second leads, wherein said light emitting portion and said protecting element portion are respectively a light emitting element chip and a protecting element, said light emitting element chip being mounted on a tip of said first lead, an electrode connected to said first conductivity type layer of said light emitting element chip being electrically connected to said first lead, an electrode connected to said second conductivity type layer of said light emitting element chip being electrically connected to said second lead, said protecting element being mounted on one of said first and second leads and electrically connected between said first and second leads so as to protect said light emitting element chip.

2. A semiconductor light emitting device according to claim 1, wherein said protecting element portion is a zener diode.

3. A semiconductor light emitting device according to claim 1, wherein a recess portion having a curved surface is formed at a tip of said first lead to mount said light emitting element chip on a bottom surface of said recess portion, and a flange being provided at one part in an upper surface of said recess portion to provide said protecting element on a surface of said flange.

4. A semiconductor light emitting device according to claim 1, wherein said second lead has a separating groove separating the tip of said second lead into two regions, said electrode connected to said second conductivity layer of said light emitting element chip being electrically connected to one region of said second lead, said protecting element being mounted on the other region at the tip of said second lead.

5. A semiconductor light emitting device according to claim 1, wherein said first and second leads are of a sheet member, a recess portion having a curved surface being formed at a tip of said first lead, said light emitting element chip being mounted on a bottom surface of said recess portion, one of said first and second leads has a flat portion at a lateral surface thereof on which said protecting element is bonded.

6. A semiconductor light emitting device according to claim 5, wherein said protecting element is encapsulated by a thermal resistive encapsulating material and a package encapsulating said light emitting element chip being provided to cover said thermal resistive encapsulating material.

7. A semiconductor light emitting device according to claim 5, wherein a thermal resistive encapsulating material is provided covering at least part of said first and second leads at position of said first and second leads reverse to a side of providing said light emitting element chip rather than a position of providing said protecting element, and a package encapsulating said light emitting element chip being provided so as to cover said thermal resistive encapsulating material.

8. A semiconductor light emitting device according to claim 1, wherein said first and second leads are provided in parallel with each other to have a recess portion having a curved surface provided in a continuous manner at the tips of said first and second leads, said light emitting element chip being mounted in said recess of said first lead, said protecting element being mounted in said recess of said second lead.

9. A semiconductor light emitting device according to claim 1, wherein a recess provided at the tip of said first lead is formed in a recess oval in plan to have a curved surface, said light emitting chip and said protecting element provided side by side in said recess.

10. A semiconductor light emitting device according to claim 8, wherein said protecting element is provided such that a surface of said protecting element is lower than a surface of said light emitting element chip.

11. A semiconductor light emitting device according to claim 9, wherein said protecting element is provided such that a surface of said protecting element is lower than a surface of said light emitting element chip.

12. A semiconductor light emitting device according to claim 1, wherein said protecting element is bonded such that electrodes thereof are respectively in direct electrical connection to said first and second leads.

13. A semiconductor light emitting device according to claim 12, wherein one of said first and second leads has a projecting portion formed at an opposing lateral wall, said protecting element being bonded between said projecting portion and the other of said first and second leads.

14. A semiconductor light emitting device incorporating therein with:

a light emitting portion formed by semiconductor overlying layers including a first conductivity layer and a second conductivity layer in order to form a light emitting layer; and a protecting element portion provided in electrical connection between said first conductivity type layer and said second conductivity type layer so that said light emitting portion is protected against at least a reverse voltage applied to said light emitting portion, wherein said light emitting portion and said protecting element portion are respectively a light emitting chip and a protecting element, said light emitting element chip has an n-side electrode and p-side electrode on one surface side of said light emitting portion and has a substrate made of a material transmissible of the light emitted thereby on the other surface side of said light emitting portion, said protecting element has two electrodes provided on one surface side thereof so as to be directly connected respectively with said n-side electrode and p-side electrode of said light emitting element chip, said light emitting element chip being bonded on said protecting element in a structure for radiating light through said substrate of said light emitting element chip such that said n-side electrode and said p-side electrode are respectively connected with said two electrodes of said protecting element.

15. A semiconductor light emitting device according to claim 14, wherein a recess portion having a curved surface is formed in said first lead, said protecting element at the other surface is adhered to said recess portion.

16. A semiconductor light emitting device according to claim 14, wherein said protecting element at the other surface is adhered to an chip-type insulating base plate having at opposite end portions terminal electrodes.

17. A semiconductor light emitting device incorporating therein with:

a light emitting portion formed by semiconductor overlying layers including a first conductivity layer and a second conductivity layer in order to form a light emitting layer;

a protecting element portion provided in electrical connection between said first conductivity type layer and said second conductivity type layer so that said light emitting portion is protected against at least a reverse voltage applied to said light emitting portion;

a chip-type insulating base plate having first and second terminal electrodes at opposite end portions, said light emitting portion and said protecting element being respectively a light emitting element chip and a protecting element separated from each other, said light emitting element chip and said protecting element being mounted directly on said insulating base plate or said terminal electrode, an electrode of said light emitting element chip connected to said first conductivity layer thereof being electrically connected with said first terminal electrode, an electrode of said light emitting element chip connected to said second conductivity layer thereof being electrically connected to said second terminal electrode, said protecting element being electrically connected between said first and second terminal electrodes so as to protect said light emitting element chip.

18. A semiconductor light emitting device according to claim 17, wherein both said light emitting element chip and said protecting element are mounted on one of said first and second terminal electrodes.

19. A semiconductor light emitting device according to claim 17, wherein said light emitting element chip and said protecting element are separately mounted on one of said first and second terminal electrodes.

20. A semiconductor light emitting device according to claim 17, wherein said first and second terminal electrodes have respective opposite ends defining a given gap therebetween, said electrodes of said light emitting element chip and said electrodes of said protecting element respectively in direct connection with said first and second terminal electrodes.

21. A semiconductor light emitting device incorporating therein with:
a light emitting portion formed by semiconductor overlying layers including a first conductivity layer and a second conductivity layer in order to form a light emitting layer; and
a protecting element portion provided in electrical connection between said first conductivity type layer and said second conductivity type layer so that said light emitting portion is protected against at least a reverse voltage applied to said light emitting portion, wherein said light emitting portion and said protecting element portion are formed on a same substrate, a chip of a semiconductor light emitting device incorporating said protecting element portion for protecting said light emitting portion being formed by one chip, wherein said protecting element portion is of a diode structure having semiconductor layers including an n-type region and a p-type region in order to form a diode, wherein said light emitting portion is formed by semiconductor overlying layers including an n-type layer and a p-type layer to form a light emitting layer, the electrical connection between said n-type layer of said light emitting portion and a p-type region of said diode structure and/or said p-type layer of said light emitting portion and said n-type region of said diode structure is performed through an interconnect laid on an insulating film provided on said semiconductor overlying layers, wherein the electrode of said light emitting portion connected with said n-type layer and/or said p-type layer thereof is provided on said p-type region and/or said n-type region of said diode structure.

22. A semiconductor light emitting device according to claim 21, wherein said n-type region and said p-type region of said diode structure are formed by semiconductor overlying layers.

23. A semiconductor light emitting device according to claim 21, wherein said diode structure is a doublehetero structure.

24. A semiconductor light emitting device according to claim 21, wherein at least one of said n-type region and said p-type region of said diode structure is formed by introducing an impurity into the other conductivity type of said semiconductor layer.

25. A semiconductor light emitting device incorporating therein with:
a light emitting portion formed by semiconductor overlying layers including a first conductivity layer and a second conductivity layer in order to form a light emitting layer;
a protecting element portion provided in electrical connection between said first conductivity type layer and said second conductivity type layer so that said light emitting portion is protected against at least a reverse voltage applied to said light emitting portion;
wherein said light emitting portion and said protecting element portion are formed on a same substrate, a chip of a semiconductor light emitting device incorporating said protecting element portion for protecting said light emitting portion being formed by one chip, wherein said light emitting portion is formed by semiconductor overlying layers including said first conductivity type layer and said second conductivity type layer to form a light emitting layer, said protecting element portion comprising a diode portion formed, in order, by a second conductivity type region by introducing an impurity into said first conductivity type layer exposed by removing part of said semiconductor overlying layers and a first conductivity type region, an electrode being provided on said exposed first conductivity layer in a manner extending over said second conductivity type region, and electrodes being provided respectively connected to said second conductivity type layer of said semiconductor overlying layer and said first conductivity type region of said diode portion.

26. A semiconductor light emitting device comprising:
a substrate;
a semiconductor overlying layers including a first conductivity type layer and a second conductivity type layer which are laminated on said substrate;
a separation groove provided on said semiconductor overlying layers thrusting through said second conductivity type layer which is an upper layer of said semiconductor overlying layers;
a light emitting portion formed by a part of said semiconductor overlying layers separated by said separation groove;
a protecting diode portion formed by a first conductivity type second layer provided on another part of said semiconductor overlying layers separated by said separation groove;
a first electrode formed by electrically connecting on said first conductivity type layer exposed by said separation groove and said second conductivity type layer of said another part of said semiconductor overlying layers; and
a second electrode formed by electrically connecting to the surface side semiconductor layer of said light emitting portion and to the surface side semiconductor layer of said protecting diode portion, respectively.

27. A semiconductor light emitting device according to claim 26, wherein an active layer is interposed between said first conductivity type layer and said second conductivity type layer of said light emitting portion to form a double heterojunction structure.

* * * * *